United States Patent
Wang et al.

(10) Patent No.: US 10,340,860 B1
(45) Date of Patent: Jul. 2, 2019

(54) MULTI-MODE LOW NOISE AMPLIFIER

(71) Applicant: QUALCOMM INCORPORATED, San Diego, CA (US)

(72) Inventors: Chuan Wang, San Diego, CA (US); Wei Cheng, San Diego, CA (US); Kevin Hsi Huai Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/138,765

(22) Filed: Sep. 21, 2018

(51) Int. Cl.
*H04B 1/18* (2006.01)
*H03F 1/26* (2006.01)
*H03F 1/56* (2006.01)

(52) U.S. Cl.
CPC ............. *H03F 1/26* (2013.01); *H03F 1/565* (2013.01); *H03F 2200/294* (2013.01)

(58) Field of Classification Search
CPC ... H04B 1/16; H04B 1/18; H04B 1/28; H04B 1/123; H03F 1/26; H03F 1/565; H03F 1/302; H03F 3/191; H03G 1/0088
See application file for complete search history.

(56) References Cited

U.S. PATENT DOCUMENTS

| 6,768,377 | B2 | 7/2004 | Macedo | |
|---|---|---|---|---|
| 7,205,844 | B2 | 4/2007 | Su et al. | |
| 9,496,906 | B2 | 11/2016 | Rafi | |
| 10,177,715 | B1* | 1/2019 | Ayranci | H03F 1/26 |
| 2006/0154636 | A1* | 7/2006 | Shah | H03H 7/0153 455/290 |
| 2018/0175797 | A1* | 6/2018 | Lee | H03F 1/56 |

OTHER PUBLICATIONS

Hashemi H., et al., "Concurrent Multiband Low-Noise Amplifiers—Theory, Design, and Applications", IEEE Transactions on Microwave Theory and Techniques, vol. 50, No. 1, Jan. 2002, pp. 288-301.
Li J-Y., et al., "Wideband and High Isolation RF Carrier-Aggregated Switch module for LTE-Advanced Base Station", Proceedings of the 46th European Microwave Conference, 2016, pp. 695-698.

* cited by examiner

*Primary Examiner* — Thanh C Le
(74) *Attorney, Agent, or Firm* — Smith Tempel Blaha LLC/Qualcomm

(57) ABSTRACT

A circuit includes a passive low gain low noise amplifier (LNA) configured to receive a communication signal, an active low gain LNA configured to receive the communication signal, a shared coupling circuit, outputs of the passive low gain LNA and the active low gain LNA coupled to the shared coupling circuit, an output circuit, an output of the shared coupling circuit coupled to the output circuit, and a high gain LNA configured to receive the communication signal, the high gain LNA coupled to the output circuit along a path that bypasses the shared coupling circuit.

18 Claims, 16 Drawing Sheets

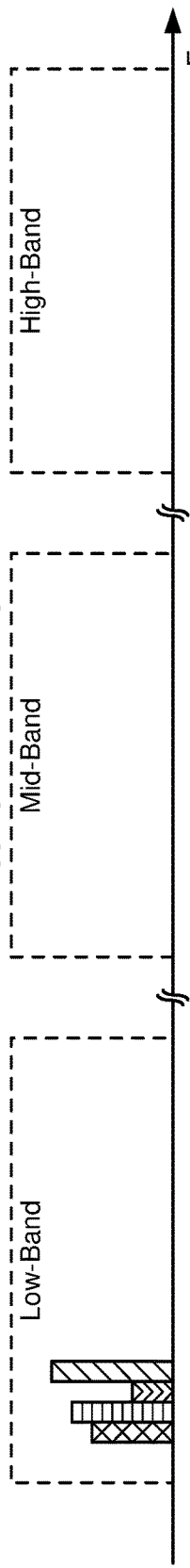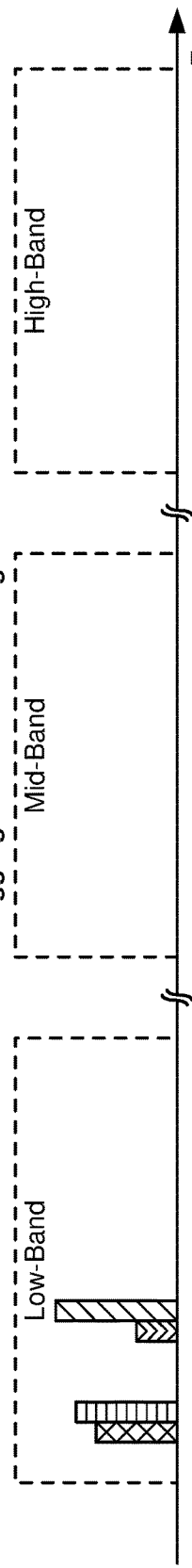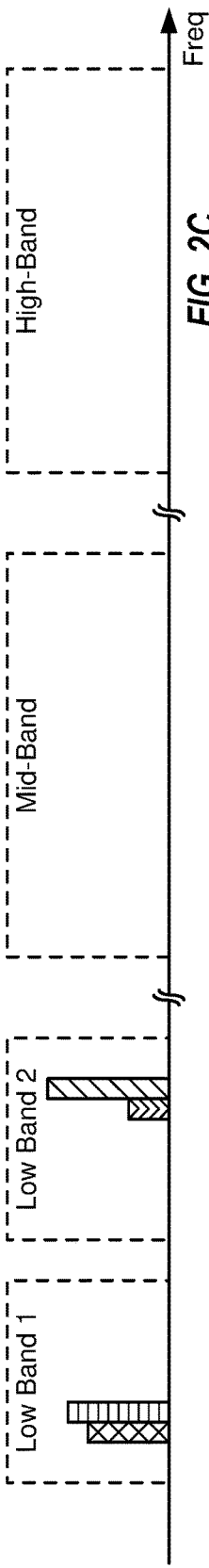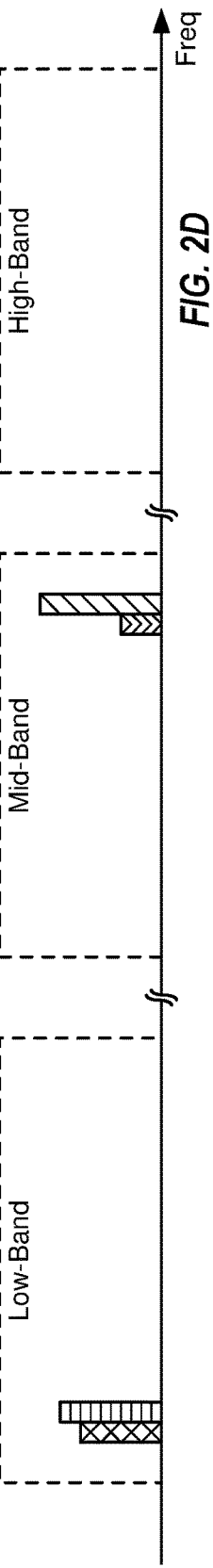
FIG. 2A  Intra-Band Carrier Aggregation on Contiguous Carriers
FIG. 2B  Intra-Band Carrier Aggregation on Non-Contiguous Carriers
FIG. 2C  Inter-Band Carrier Aggregation in Same Band Group
FIG. 2D  Inter-Band Carrier Aggregation in Different Band Groups

US 10,340,860 B1

MULTI-MODE LOW NOISE AMPLIFIER

FIELD

The present disclosure relates generally to electronics, and more specifically to radio frequency (RF) receivers.

BACKGROUND

Wireless communication devices and technologies are becoming ever more prevalent. Wireless communication devices generally transmit and receive communication signals. A signal received by a communication device is processed to recover the transmitted information signal. A receiver in a communication device generally includes filtering, amplifying, demodulating, decoding, and other processing elements. A receiver may include a low noise amplifier (LNA), or a number of LNAs and one or more active and/or passive matching circuits, filtering circuits and switching circuits as part of a receiver "front-end" configured to process one or more communication signals.

One such communication signal may be referred to as an LTE-LAA (licensed assisted access) communication signal. LTE-LAA is a technology that allows an LTE communication device access to unlicensed communication spectrum to complement a licensed access mobile network, such as an LTE network, a 5G network, or another licensed access mobile network. A WLAN communication signal also typically uses unlicensed communication spectrum. Examples of a WLAN signal include WiFi, or other communication signals that use unlicensed communication spectrum in the range of, for example, 5 GHz to 6 GHz.

As wireless communication devices continue to evolve, a single communication device may be configured to process multiple received signals on multiple communication frequencies and at multiple power levels. For example, a communication device may process LTE-LAA communication signals and WLAN communications signals concurrently.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a circuit including a passive low gain low noise amplifier (LNA) configured to receive a communication signal, an active low gain LNA configured to receive the communication signal, a shared coupling circuit, outputs of the passive low gain LNA and the active low gain LNA coupled to the shared coupling circuit, an output circuit, an output of the shared coupling circuit coupled to the output circuit, and a high gain LNA configured to receive the communication signal, the high gain LNA coupled to the output circuit along a path that bypasses the shared coupling circuit.

Another aspect of the disclosure provides a method for a low noise amplifier (LNA) including receiving a communication signal in a high gain low noise amplifier (LNA), the high gain LNA coupled to an output circuit, receiving the communication signal in a passive low gain LNA and an active low gain LNA, the passive low gain LNA and the active low gain LNA coupled to a shared coupling circuit, an output of the shared coupling circuit coupled to the output circuit, and amplifying the communication signal using one or more of the high gain LNA, the passive low gain LNA and the active low gain LNA.

Another aspect of the disclosure provides a device including first means for amplifying with low noise a communication signal, second means for amplifying with low noise the communication signal, and means for outputting an amplified signal, the means for outputting being coupled to the first means for amplifying and the second means for amplifying, and being configurable in a first mode for transforming and a second mode for impedance matching.

Another aspect of the disclosure provides a low noise amplifier circuit including a first LNA configured to receive a communication signal, a second LNA configured to receive the communication signal, and a shared coupling circuit having a primary side and a secondary side, the secondary side comprising an upper secondary side and a lower secondary side, the secondary side comprising a center tap coupled to a node between the upper secondary side and the lower secondary side, wherein the first LNA is selectively coupled to the lower secondary side of the shared coupling circuit, the second LNA is coupled to the primary side of the shared coupling circuit, and an output of the shared coupling circuit is provided over the center tap.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

FIG. 2A is a graphical diagram showing an example of contiguous intra-band carrier-aggregation (CA).

FIG. 2B is a graphical diagram showing an example of non-contiguous intra-band CA.

FIG. 2C is a graphical diagram showing an example of inter-band CA in the same band group.

FIG. 2D is a graphical diagram showing an example of inter-band CA in different band groups.

DETAILED DESCRIPTION

Figure 1:
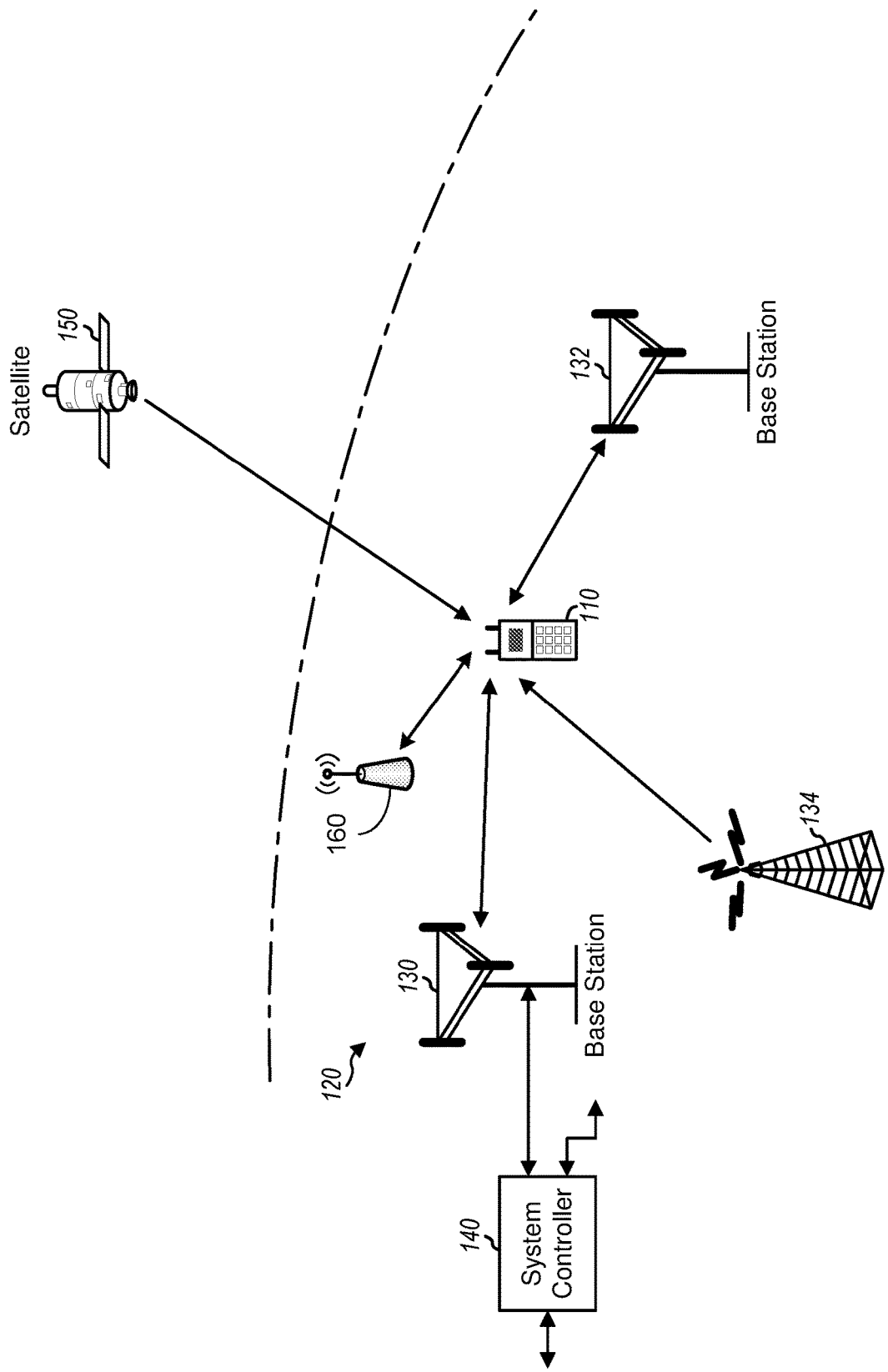
FIG. 1 is a diagram showing a wireless device communicating with a wireless communication system.

The word "exemplary" is used herein to mean "serving as an example, instance, or illustration." Any aspect described herein as "exemplary" is not necessarily to be construed as preferred or advantageous over other aspects.

Exemplary embodiments of the disclosure are directed to a receiver front end that may include one or more low noise amplifiers and related impedance matching and switching circuitry to concurrently process a received signal having both an LTE-LAA communication signal and a WLAN communication signal. Such a receiver front end may provide a high dynamic range in an efficient circuit topology that reduces or minimizes area and that reduces or minimizes power consumption. Since an LTE-LAA communication signal and a WLAN communication signal may be received from different base stations and may travel through different physical paths, the signal levels could be quite different and thus demand different link budgets. A receiver front end with high dynamic range can be configured to provide different gain control to each signal, while still maintaining sufficient signal to noise and distortion ratio. Such a high dynamic range receiver front-end, however, should be designed to avoid performance degradation when it is operating at a single operation mode, where it is only receiving one of the above-mentioned signals. For example, performance of certain exemplary receiver front-ends described herein may be at least approximately equivalent to legacy devices that practice only one technology, for example WLAN or LTE.

A reconfigurable low noise amplifier may be configured to provide various levels of amplification in a dual subscriber identity module (SIM) dual active (DSDA) configuration. Exemplary embodiments of a low noise amplifier may provide concurrent high gain, concurrent low gain, and concurrent high and low gain signal amplification for both an LTE-LAA communication signal and a WLAN communication signal. Exemplary embodiments of a low noise amplifier may provide reconfigurable dual gain signal amplification for both an LTE-LAA communication signal and a WLAN communication signal. Exemplary embodiments of a low noise amplifier may provide high gain signal amplification and low gain signal amplification in a legacy mode for each of an LTE-LAA signal and a WLAN signal.

In an exemplary embodiment, a low noise amplifier may be configured to receive and amplify one or more communication signals from different frequency bands, such as, for example, one or more of LTE, CDMA, 4G, 5G, cellular, Bluetooth, etc.

In an exemplary embodiment, a low noise amplifier may be configured to receive and amplify signals from two or more communication standards concurrently.

In an exemplary embodiment, the terms "high gain" and "low gain" may be relative to each other, where a "high gain" device will have a gain that may be higher than a gain of a "low gain" device, and where a "low gain" device will have a gain that may be lower than a gain of a "high gain" device. Further, the terms "high gain" and "low gain" may be relative to other amplification devices.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, 5G, etc.

Wireless device 110 may support carrier aggregation, which is operation on multiple carriers. Carrier aggregation may also be referred to as multi-carrier operation. In some embodiments, a single stream of data is concurrently transmitted using multiple carriers using carrier aggregation, for example as opposed to separate carriers being used for respective data streams.

Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11.

The wireless device 110 may also be in communication with a wireless device 160. In an exemplary embodiment, the wireless device 160 may be a wireless access point, or another wireless communication device that comprises, or comprises part of a wireless local area network (WLAN). An exemplary embodiment of a WLAN signal may include WiFi, for example implemented pursuant to IEEE 802.11, or other communication signals that use unlicensed communication spectrum in the range of, for example, 5 GHz to 6 GHz.

In general, carrier aggregation (CA) may be categorized into two types—intra-band CA and inter-band CA. Intra-band CA refers to operation on multiple carriers within the same band. Inter-band CA refers to operation on multiple carriers in different bands.

FIG. 2A is a graphical diagram showing an example of contiguous intra-band carrier-aggregation (CA). In the example shown in FIG. 2A, wireless device 110 is configured with four contiguous carriers in one band in low-band. Wireless device 110 may send and/or receive transmissions on the four contiguous carriers within the same band.

FIG. 2B is a graphical diagram showing an example of non-contiguous intra-band CA. In the example shown in FIG. 2B, wireless device 110 is configured with four non-contiguous carriers in one band in low-band. The carriers may be separated by 5 MHz, 10 MHz, or some other amount. Wireless device 110 may send and/or receive transmissions on the four non-contiguous carriers within the same band.

FIG. 2C is a graphical diagram showing an example of inter-band CA in the same band group. In the example shown in FIG. 2C, wireless device 110 is configured with four carriers in two bands in low-band. Wireless device 110 may send and/or receive transmissions on the four carriers in different bands in the same band group.

FIG. 2D is a graphical diagram showing an example of inter-band CA in different band groups. In the example shown in FIG. 2D, wireless device 110 is configured with four carriers in two bands in different band groups, which include two carriers in one band in low-band and two carriers in another band in mid-band. Wireless device 110 may send and/or receive transmissions on the four carriers in different bands in different band groups.

FIGS. 2A to 2D show four examples of carrier aggregation. Carrier aggregation may also be supported for other combinations of bands and band groups.

Figure 3:
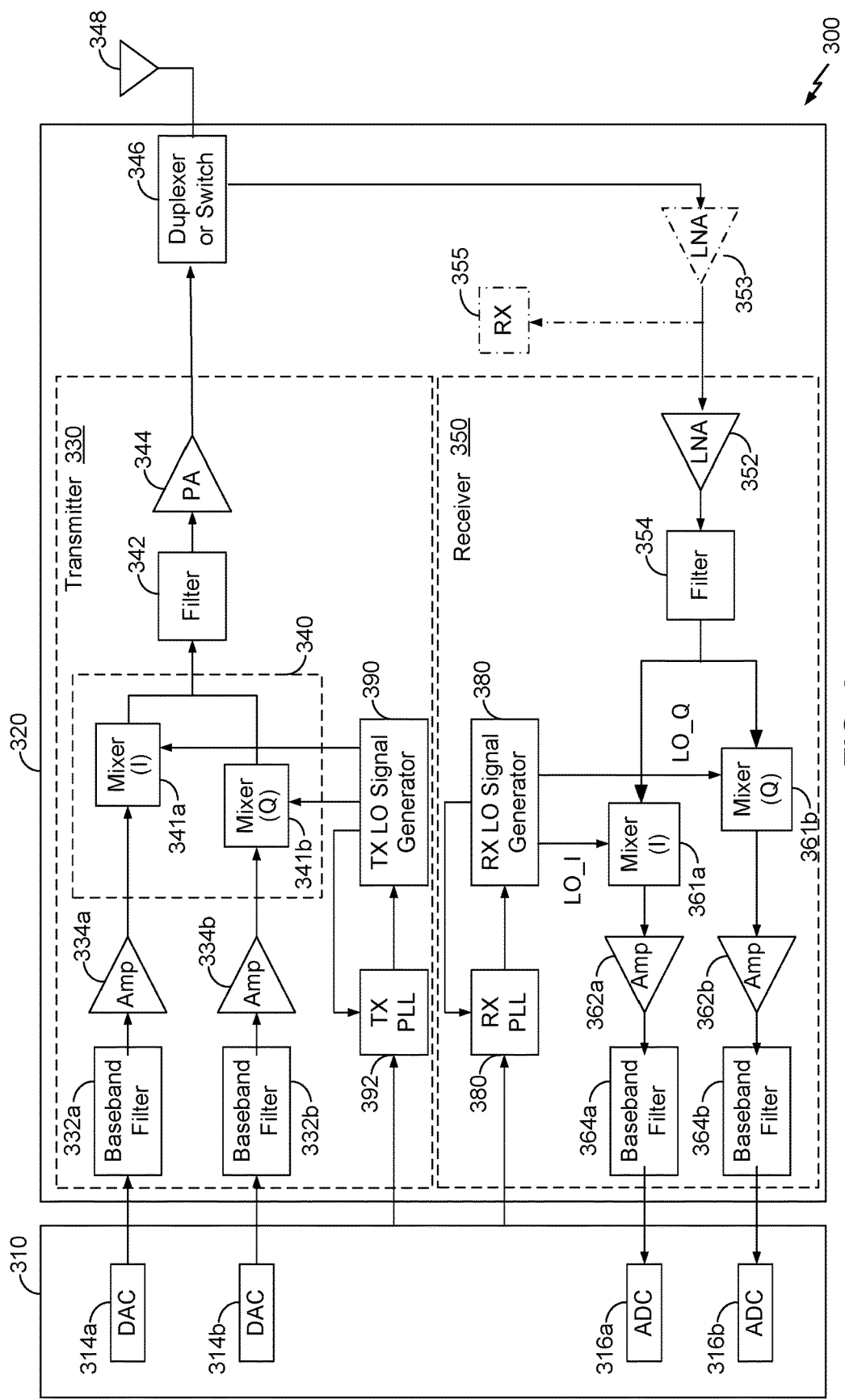
FIG. 3 is a block diagram showing a wireless device in which the exemplary techniques of the present disclosure may be implemented.

FIG. 3 is a block diagram showing a wireless device 300 in which the exemplary techniques of the present disclosure may be implemented. FIG. 3 shows an example of a transceiver 320. In general, the conditioning of the signals in a transmitter 330 and a receiver 350 may be performed by one or more stages of amplifier, filter, upconverter, downconverter, etc. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, wireless device 300 generally comprises a transceiver 320 and a data processor 310. The data processor 310 may include a memory (not shown) to store data and program codes, and may generally comprise analog and digital processing elements. The transceiver 320 includes a transmitter 330 and a receiver 350 that support bi-directional communication. In general, wireless device 300 may include any number of transmitters and/or receivers for any number of communication systems and frequency bands. All or a portion of the transceiver 320 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband, or near baseband, in one stage. The super-heterodyne and direct-conversion architectures may use different circuit blocks and/or have different requirements. In the example shown in FIG. 3, transmitter 330 and receiver 350 are implemented with the direct-conversion architecture.

In the transmit path, the data processor 310 processes data to be transmitted and provides in-phase (I) and quadrature (Q) analog output signals to the transmitter 330. In an exemplary embodiment, the data processor 310 includes digital-to-analog-converters (DAC's) 314a and 314b for converting digital signals generated by the data processor 310 into the I and Q analog output signals, e.g., I and Q output currents, for further processing. In other embodiments, the DACs 314a and 314b are included in the transceiver 320 and the data processor 310 provides data (e.g., for I and Q) to the transceiver 320 digitally.

Within the transmitter 330, lowpass filters 332a and 332b filter the I and Q analog transmit signals, respectively, to remove undesired images caused by the prior digital-to-analog conversion Amplifiers (Amp) 334a and 334b amplify the signals from lowpass filters 332a and 332b, respectively, and provide I and Q baseband signals. An upconverter 340 upconverts the I and Q baseband signals with I and Q transmit (TX) local oscillator (LO) signals from a TX LO signal generator 390 and provides an upconverted signal. A filter 342 filters the upconverted signal to remove undesired images caused by the frequency upconversion as well as noise in a receive frequency band. A power amplifier (PA) 344 amplifies the signal from filter 342 to obtain the desired output power level and provides a transmit RF signal. The transmit RF signal is routed through a duplexer or switch 346 and transmitted via an antenna 348.

In the receive path, antenna 348 receives communication signals and provides a received RF signal, which is routed through duplexer or switch 346 and provided to a low noise amplifier (LNA) 352. The duplexer 346 is designed to operate with a specific RX-to-TX duplexer frequency separation, such that RX signals are isolated from TX signals.

Optionally, an LNA 353 may be implemented to amplify the received signal (e.g., as routed through the duplexer 346) prior to the signal being provided to the LNA 352. One or more other components (e.g., filters, switches, etc., not illustrated) may be implemented between the LNA 353 and the LNA 352. While a single path is illustrated in FIG. 3 between the LNA 353 and the LNA 352, such path may comprise a plurality of outputs from the LNA 353, which may be coupled to a plurality of stages of the LNA 352 or to a plurality of instances of the LNA 352. Each of the instances of the LNA 352 may be associated with an instance of a receive path comprising elements described below in connection with the reception of the RF signal. In some embodiments, the multiple outputs from the LNA 353 may be coupled to a plurality of receivers, for example the receiver 350 and a receiver 355. In such embodiments, the receivers 350 and 355 may be configured to amplify and/or process different radio access technologies. For example, the receiver 350 may be configured to process one or more types of WAN signals, while the receiver 355 is configured to process WLAN signals. The transceiver 320 may further be configured to implement transmission components (not illustrated) for the technology supported by the receiver 355, and the receiver 355 may include certain components similar to those illustrated with respect to the receiver 350.

The received RF signal is amplified by LNA 352 and filtered by a filter 354 to obtain a desired RF input signal. Downconversion mixers 361a and 361b mix the output of filter 354 with I and Q receive (RX) LO signals (i.e., LO_I and LO_Q) from an RX LO signal generator 380 to generate I and Q baseband signals. The I and Q baseband signals are amplified by amplifiers 362a and 362b and further filtered by lowpass filters 364a and 364b to obtain I and Q analog input signals, which are provided to data processor 310. In the exemplary embodiment shown, the data processor 310 includes analog-to-digital-converters (ADC's) 316a and 316b for converting the analog input signals into digital signals to be further processed by the data processor 310. In some embodiments, the ADCs 316a and 316b are included in the transceiver 320 and provide data to the data processor 310 digitally.

In FIG. 3, TX LO signal generator 390 generates the I and Q TX LO signals used for frequency upconversion, while RX LO signal generator 380 generates the I and Q RX LO signals used for frequency downconversion. Each LO signal is a periodic signal with a particular fundamental frequency. A phase locked loop (PLL) 392 receives timing information from data processor 310 and generates a control signal used to adjust the frequency and/or phase of the TX LO signals from LO signal generator 390. Similarly, a PLL 382 receives timing information from data processor 310 and generates a control signal used to adjust the frequency and/or phase of the RX LO signals from LO signal generator 380.

Wireless device 300 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain elements of the transceiver 320 are functionally illustrated in FIG. 3, and the configuration illustrated therein may or may not be representative of a physical device configuration in certain implementations. For example, as described above, transceiver 320 may be implemented in various integrated circuits (ICs), RF ICs (RFICs), mixed-signal ICs, etc. In some embodiments, the transceiver 320 is implemented on a substrate or board such as a printed circuit board (PCB) having various modules (on which the duplexer 346 may also be implemented). For example, the PA 344, the filter 342, the LNA 353, the receiver 355, and the duplexer 346 may be implemented in separate modules or chips or as discrete components, while the remaining elements illustrated in the transceiver 320 (e.g., remaining components of the transmitter 330 and the receiver 350) may be implemented in a single transceiver chip.

The power amplifier 344 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 344 can be configured to operate using one or more bias signals and can be configured in various topologies or architectures.

Exemplary embodiments of the disclosure are directed to a radio frequency (RF) receiver having a low noise amplifier that can be configured to concurrently process communication signals in both LTE-LAA and WLAN communication bands. Exemplary embodiments of a low noise amplifier that can be configured to concurrently process communication signals in multiple communication bands, such as, for example in both LTE-LAA and WLAN communication bands, may be implemented within, or as part of, the LNA 352 or the LNA 353.

Figure 4:
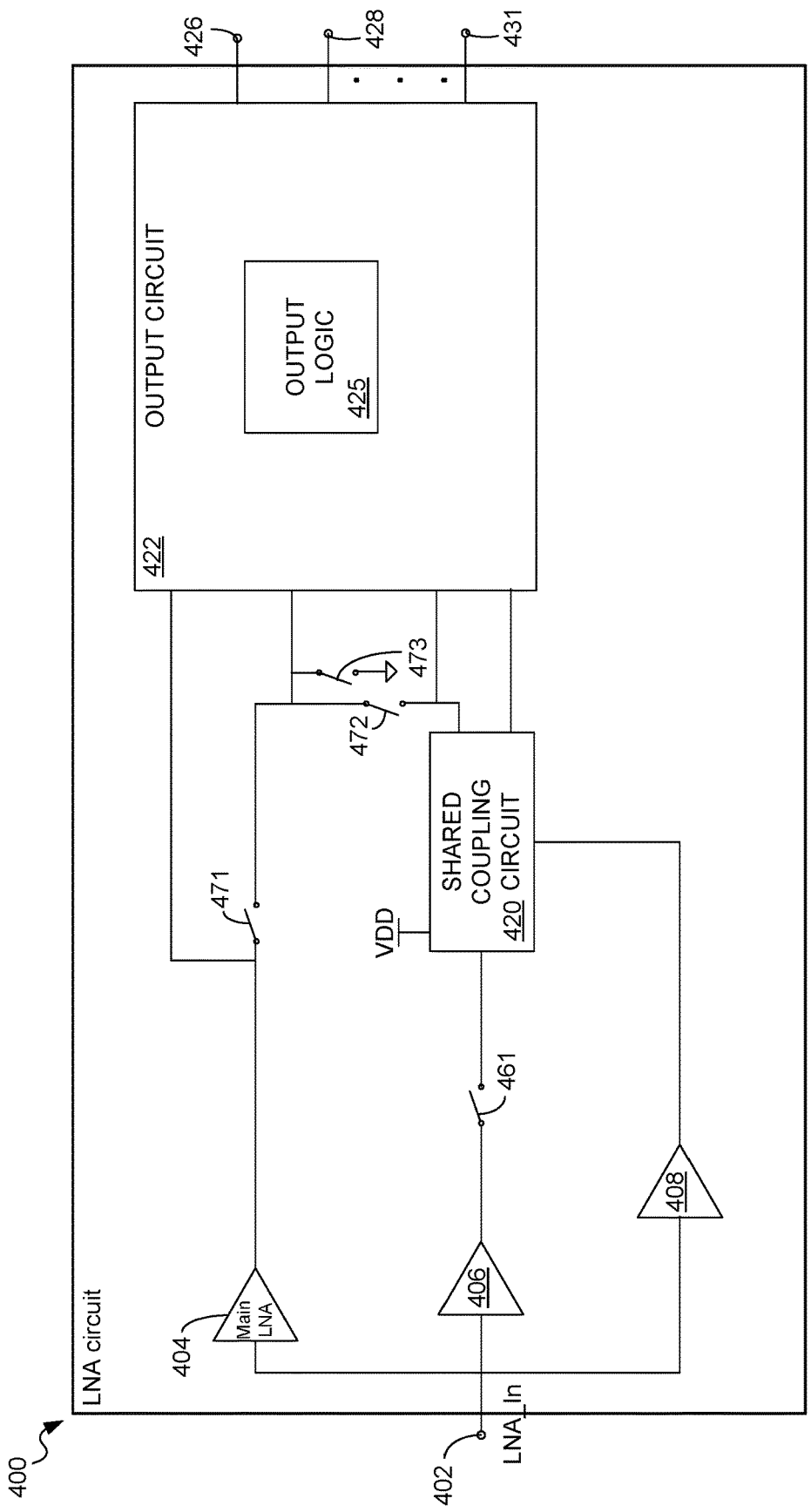
FIG. 4 is a block diagram of a low noise amplifier (LNA) circuit in accordance with an exemplary embodiment of the disclosure.

FIG. 4 is a block diagram of a low noise amplifier (LNA) circuit 400 in accordance with an exemplary embodiment of the disclosure. The LNA circuit 400 may be part of a receiver, part of a receiver front end, and may be part of the low noise amplifier 352 (FIG. 3). The LNA circuit 400 includes an input terminal 402 over which a radio frequency (RF) input signal, LNA_IN, may be provided to a main, or high gain, low noise amplifier (LNA) 404, to a low gain LNA 406 and to a low gain LNA 408. The low gain LNA 406 may be configured as a passive low gain LNA in some embodiments, and the low gain LNA 408 may be configured as an active low gain LNA in some embodiments. The LNA 404 may be an active amplifier in some embodiments. The LNA_IN signal may be provided by a filter circuit (not shown), such as a diplexer circuit, a duplexer circuit, or another circuit, such as the duplexer or switch 346 (FIG. 3). In an exemplary embodiment, the LNA_IN signal may be a quadrature communication signal and the LNA circuit 400 may be configured as a quadrature low noise amplifier circuit. Alternatively, the LNA circuit 400 may be configured as a single-ended LNA circuit. In an exemplary embodiment, the main LNA 404 may be configured to provide relatively high gain, on the order of, for example, 15 dB, or a range of gain on the order of, for example, about 10 dB to about 20 dB. In an exemplary embodiment, the passive low gain LNA 406 may be configured to provide relatively low gain, on the order of, for example, −3 dB, or a range of gain on the order of, for example, about −3 dB to about −7 dB. In an exemplary embodiment, the active low gain LNA 408 may also be configured to provide relatively low gain, on the order of, for example, about −3 dB to about −7 dB.

The output of the main LNA 404 may be provided to an output circuit 422 and to a switch 471. In an exemplary embodiment, an output of the (passive) low gain LNA 406 may be provided to a shared coupling circuit 420 through a switch 461.

In an exemplary embodiment, an output of the (active) low gain LNA 408 may also be provided to the shared coupling circuit 420. The shared coupling circuit 420 may comprise electromagnetic components including, for example, an inductive circuit, an impedance matching circuit, a transformer circuit, and other elements, collectively providing electromagnetic coupling and impedance matching to the output of the (passive) low gain LNA 406 and an output of the (active) low gain LNA 408. In an exemplary embodiment, the shared coupling circuit 420 provides one or more of electromagnetic coupling and impedance matching to both the output of the (passive) low gain LNA 406 and the output of the (active) low gain LNA 408, and to the output of the LNA circuit 400.

In an exemplary embodiment, the switches 461, 471, 472 and 473 may be controlled by the data processor 310 of FIG.

3, or by another digital controller, or other controller. In an exemplary embodiment, the switches 471, 472 and 473 may be part of an interconnect circuit, or can be implemented within the output circuit 422.

In an exemplary embodiment, one or more outputs of the shared coupling circuit 420 may be provided to the output circuit 422. The output circuit 422 can be dynamically configured to provide an output from any of the LNAs to any of the outputs, or from one LNA to multiple outputs. The output circuit 422 may provide an output RF signal on first output 426 and second output 428. In an exemplary embodiment, the output circuit 422 may be configured to provide more than two outputs, with an exemplary output 431 illustrated as an exemplary third output. Additional outputs are also possible. The first output 426 and second output 428 may comprise in-phase and quadrature outputs, which may interchangeably appear on the first output 426 and the second output 428, based on a state of output logic 425 within the output circuit 422. In other embodiments, each of the outputs 426, 428, and optionally 431 provide a separate single-ended output. In an exemplary embodiment, the output logic 425 may comprise one or more of resistive elements, capacitive elements, inductive elements, active components and devices, passive components and devices, adjustable or controllable devices, switches, splitters, and other elements, some or all of which may be controlled by the data processor 310 of FIG. 3. These elements of the output logic 425 may be configured, for example, to receive instructions or information from the data processor 310 and translate such instructions or information into controls for the elements of the output circuit 422. In some embodiments, the output logic 425 may comprise a logic buffer.

In an exemplary embodiment, the LNA circuit 400 may be configured to receive and amplify signals from two or more communication standards concurrently using a dynamically configurable output circuit 422. For example, the output circuit 422 may be configured to route each communication standard signal to an output or outputs dedicated to that respective standard in some embodiments. For example, in an exemplary embodiment, the LNA circuit 400 may be configured to receive and amplify a WLAN signal and an LAA Intra-Band CA signal concurrently. The WLAN signal may be sent to output 426, the LAA Intra-B and CA signal may be sent to output 428 and 431 after the output circuit 422 splits the LAA Intra-B and CA signal.

Figure 5:
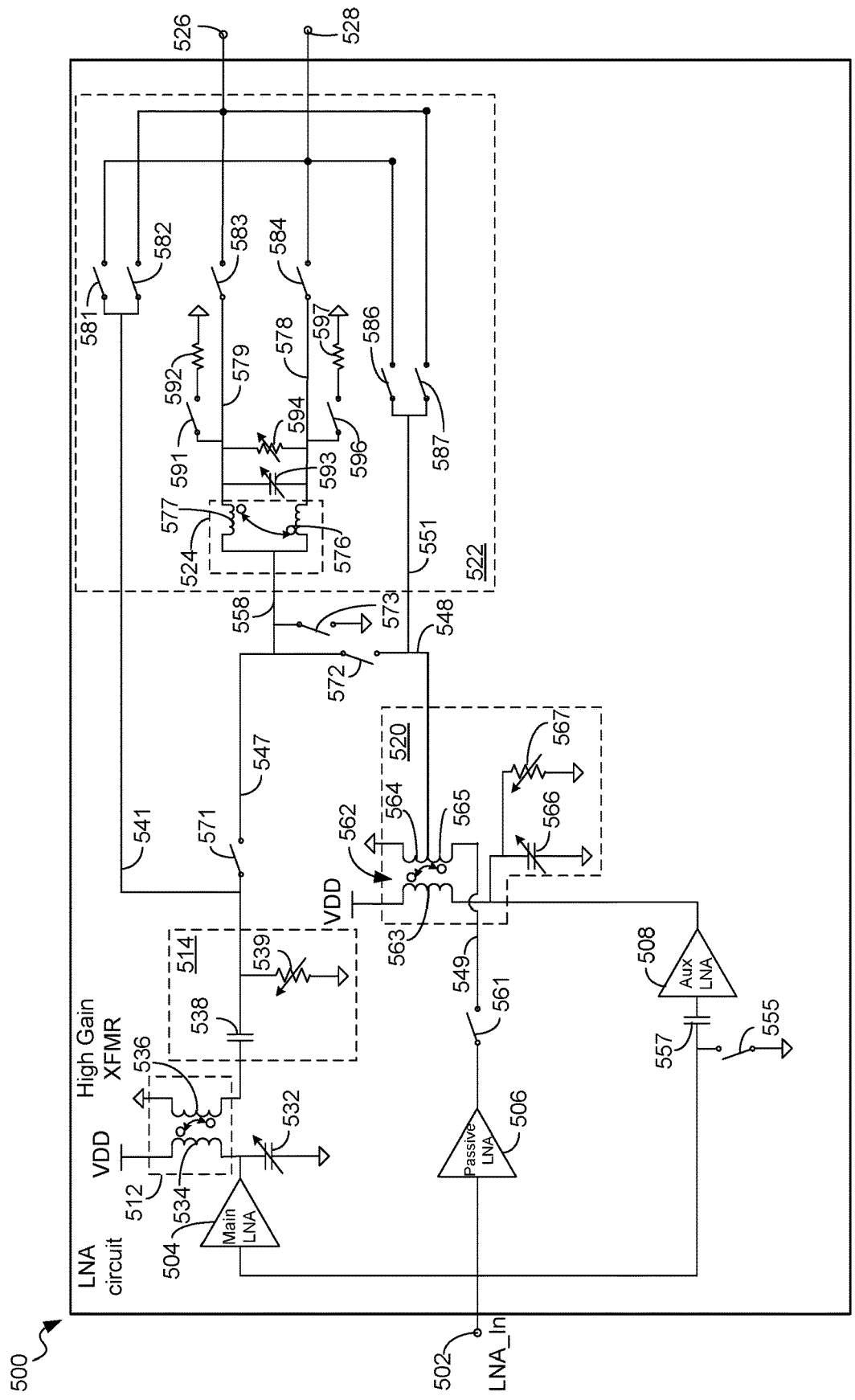
FIG. 5 is a schematic diagram of an exemplary embodiment of the LNA circuit of FIG. 4.

FIG. 5 is a schematic diagram of an exemplary embodiment of an LNA circuit 500. The LNA circuit 500 may be an exemplary embodiment of the LNA circuit 400 of FIG. 4. The LNA circuit 500 may also be part of a receiver front end, or may be part or all of the LNA 352 of FIG. 3. The LNA circuit 500 includes an input terminal 502 over which an input signal, LNA_IN, may be provided to a main, or high gain, low noise amplifier (LNA) 504, to a passive low gain LNA 506 and to an active low gain LNA 508. In an exemplary embodiment, the input signal, LNA_IN, may be provided to the active low gain LNA 508 through a capacitance 557. In an exemplary embodiment, a switch 555 may be closed to ground the input signal, LNA_IN. The LNA_IN signal may be provided by a filter circuit (not shown), such as a diplexer circuit, a duplexer circuit, or another circuit, such as the duplexer or switch 346 (FIG. 3). In an exemplary embodiment, the LNA_IN signal may be a quadrature communication signal and the LNA circuit 500 may be configured as a quadrature low noise amplifier (LNA) circuit. In another exemplary embodiment, the LNA circuit 500 may be configured as a single-ended LNA circuit.

In an exemplary embodiment, the main LNA 504 may be configured to provide relatively high gain, on the order of, for example, 15 dB. In an exemplary embodiment, the passive low gain LNA 506 may be configured to provide relatively low gain, on the order of, for example, −3 dB. In an exemplary embodiment, the active low gain LNA 508 may also be configured to provide relatively low gain, on the order of, for example, −3 dB to about −7 dB.

The output of the main LNA 504 may be provided to a high-gain transformer 512. In an exemplary embodiment, the high gain transformer 512 may comprise a primary side 534 and a secondary side 536. The primary side 534 of the high-gain transformer 512 may be coupled to a supply voltage, VDD and to ground through an adjustable capacitance 532. In an exemplary embodiment, the adjustable capacitance 532 may be controlled by a signal from the data processor 310 of FIG. 3, or by another controller. The secondary side 536 of the high-gain transformer 512 may be coupled to ground, or alternatively, may be coupled to the supply voltage, VDD, which may be an AC ground. An output of the high-gain transformer 512 may be provided to the impedance matching circuit 514. In an exemplary embodiment, the impedance matching circuit 514 may comprise a capacitance 538 and an adjustable resistance 539. In an exemplary embodiment, the adjustable resistance 539 may be controlled by a signal from the data processor 310 of FIG. 3, or by another controller. In an exemplary embodiment in which the secondary side 536 is coupled to VDD, the high-gain transformer 512 may comprise a three terminal device.

In an exemplary embodiment, the high-gain transformer 512 may have a relatively low coupling factor, referred to as "k" between the primary side 534 and the secondary side 536. The low coupling factor may provide wideband output matching and may improve out of band signal stability of the high-gain transformer 512.

In an exemplary embodiment, the output of the active low gain LNA 508 may be provided to a shared coupling circuit 520. The shared coupling circuit 520 may comprise electromagnetic components including, for example, one or more of an inductive circuit, an impedance matching circuit, a transformer circuit, and other elements, collectively providing electromagnetic coupling and impedance matching. In an exemplary embodiment, the shared coupling circuit 520 may comprise an inductive element 562, an adjustable capacitance 566 and an adjustable resistance 567. In an exemplary embodiment, the adjustable capacitance 566 and the adjustable resistance 567 may be controlled by signals from the data processor 310 of FIG. 3, or by another controller. The inductive element 562 may comprise a primary side inductive coil 563, an upper secondary side inductive coil 564 and a lower secondary side inductive coil 565. A connection 548 may form a center tap of the upper secondary side inductive coil 564 and a lower secondary side inductive coil 565. In an exemplary embodiment, the output of the active low gain LNA 508 is provided to the primary side 563 of the shared coupling circuit 520. In such an exemplary embodiment, the primary side inductive coil 563, and the upper secondary side inductive coil 564 serve as a transformer for the active low gain LNA 508. The terms "upper" and "lower" as they refer to the secondary side inductive coils 564 and 565 are used for convenience only, and are spatially invariant.

In an exemplary embodiment, the output of the passive low gain LNA 506 may be provided to the shared coupling circuit 520 through a switch 561. In an exemplary embodiment, the upper secondary side inductive coil 564 and the lower secondary side inductive coil 565 serve as a transformer, for example in an auto-transformer configuration, and provide electromagnetic coupling and impedance matching for the passive low gain LNA 506.

The output of the impedance matching circuit 514 and an output of the shared coupling circuit 520 may be provided to an output circuit 522. In an exemplary embodiment, the output circuit 522 may include one or more elements that may be switched or dynamically configured to provide one or more outputs as described herein.

In an exemplary embodiment, the output circuit 522 may comprise a splitter 524, which may include inductive elements 576 and 577. An adjustable capacitance 593 and an adjustable resistance 594 may be coupled in parallel across the outputs of the splitter 524. In an exemplary embodiment, the adjustable capacitance 593 and the adjustable resistance 594 may be controlled by signals from the data processor 310 of FIG. 3, or by another controller, for example to optimize the performance of the splitter 524 and to optimize the port-to-port isolation between the output port 526 and the output port 528. The switch 573 may be closed to deactivate the splitter 524 for configurations where no output is provided through the splitter 524.

The inductive element 577 is coupled to a switch 583 over connection 579 and the switch 583 is coupled to a first output 526. The inductive element 576 is coupled to a switch 584 over connection 578 and the switch 584 is coupled to a second output 528. In an exemplary embodiment, the switch 583 and the switch 584 may be controlled by signals from the data processor 310 of FIG. 3, or by another controller. A resistor 592 is coupled to connection 579 through a switch 591; and a resistor 597 is coupled to connection 578 through a switch 596. The switches 591 and 596 may be selectively closed to engage the resistors 592 and 597, respectively, to adjust the output return loss (S22) performance of the splitter 524. In an exemplary embodiment, the first output 526 and the second output 528 are configured to provide single-ended signal outputs.

In an exemplary embodiment, the output circuit 522 also includes switches 581, 582, 586, and 587. In an exemplary embodiment, the switches 581, 582, 586, and 587 may be controlled by signals from the data processor 310 of FIG. 3, or by another controller. An output of the impedance matching circuit 514 is provided to the switches 581 and 582 on connection 541.

In an exemplary embodiment, when the switch 571 is closed, or conductive, an output of the impedance matching circuit 514 is provided over connection 547 and connection 558 to the splitter 524. In an exemplary embodiment, the main LNA 504 is coupled to the output circuit 522 along a path that bypasses the shared coupling circuit 520.

In an exemplary embodiment, an output of the shared coupling circuit 520 may be provided over connection 548 and over connection 551 to the switches 586 and 587. The shared coupling circuit 520 may be selectively configured as at least two different types of transformers depending on how the input terminals may be connected to the passive low gain LNA 506 and to the active low gain LNA 508. For example, for the passive low gain LNA 506, when the switch 561 is closed, or conductive, an output of the passive low gain LNA 506 may be provided over connection 549 to the lower secondary side inductive coil 565 and to the upper secondary side inductive coil 564, and then over connections 548 and 551 to the switches 586 and 587. In this exemplary embodiment, the upper secondary side inductive coil 564 and the lower secondary side inductive coil 565 serve as a transformer for the passive low gain LNA 506 to provide impedance matching. For the active low gain LNA 508, the switch 561 may be open, and the shared coupling circuit 520 may be selectively configured such that the inductive coil 563 and the upper secondary side inductive coil 564 serve as a transformer for the active low gain LNA 508. The output may be provided over connection 548 and over connection 551 to the switches 586 and 587.

The LNA circuit 500 may be configured to provide amplification and impedance matching to a variety of communication signals, including LAA and WLAN communication signals, either concurrently or individually.

In an exemplary embodiment, the active low gain LNA 508 provides a high impedance (high Z) path for dual standard (LAA+WLAN) concurrent active low gain amplification.

In an exemplary embodiment, the main LNA 504, transformer 512, matching circuit 514 and the splitter 524 provides amplification for dual standard (LAA+WLAN) concurrent high gain amplification.

In an exemplary embodiment, the shared coupling circuit 520 configured as a passive transformer together with the passive low gain LNA 506 allow for the highly linear amplification of a variety of communication signals that share signal spectrum. For example, although described with respect to the amplification of LTE-LAA signals and WLAN signals, the LNA circuits described herein may be configured to amplify a variety of different communication signals including, for example, one or more of LTE, CDMA, 4G, 5G, cellular, Bluetooth, or other signals, etc. In one embodiment, LNAs as described herein may be configured for concurrent amplification of LTE signals (e.g., Band 7) and Bluetooth signals (e.g., at 2.4 GHz).

In an exemplary embodiment, although other communication signals may be amplified, the description to follow will use LAA/WLAN signals for purposes of illustration.

LAA-WLAN Concurrent High Gain Mode

Figure 6:
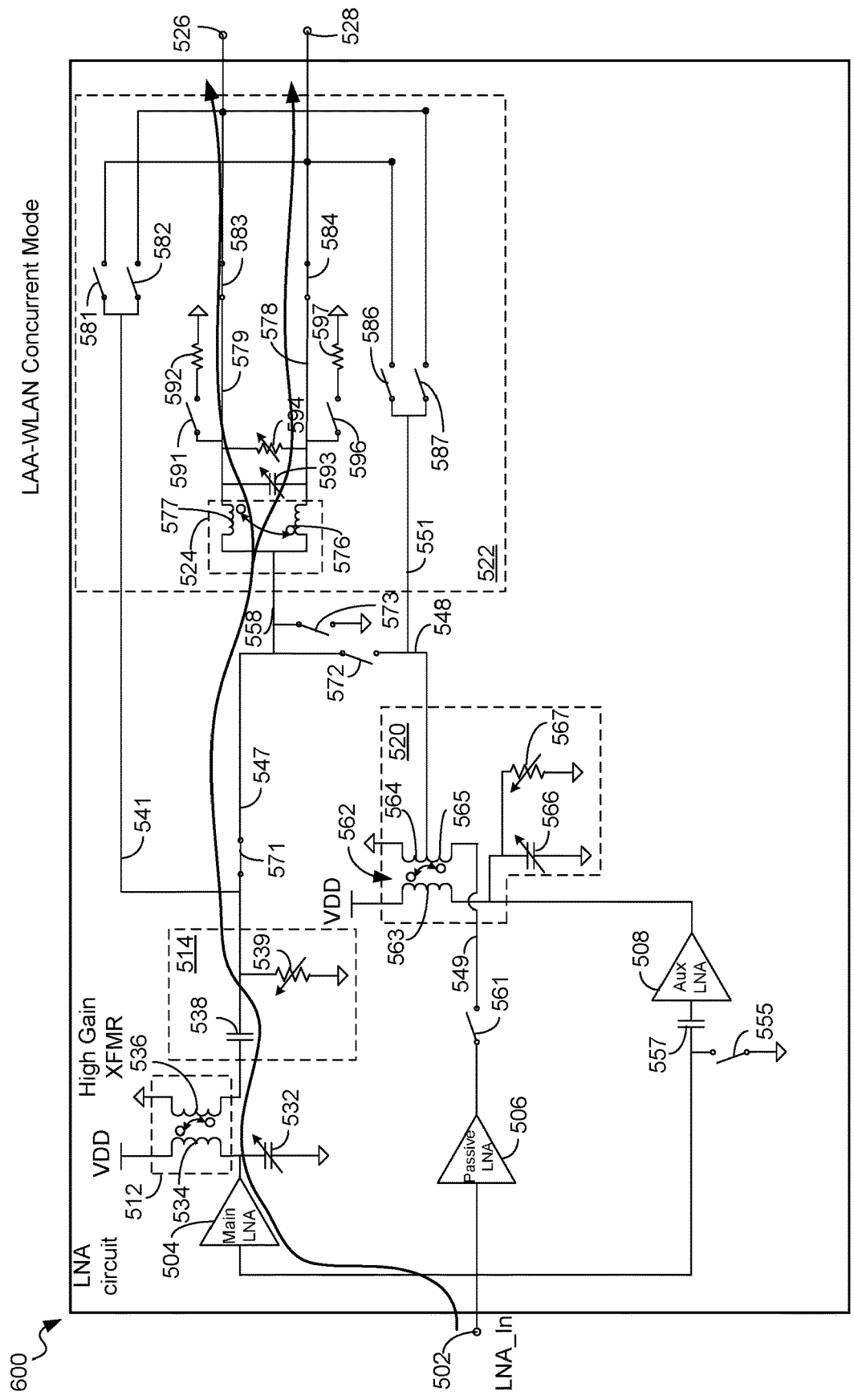
FIG. 6 is a schematic diagram of an exemplary embodiment of an LNA circuit.

FIG. 6 is a schematic diagram 600 of an exemplary embodiment of an LNA circuit. The LNA circuit 600 may be an exemplary embodiment of the LNA circuit 500 of FIG. 5, configured for LAA-WLAN concurrent high gain mode operation. In an exemplary embodiment, the main LNA 504, high-gain transformer 512, impedance matching circuit 514, and splitter 524 may be configured to provide concurrent LAA-WLAN high gain amplification to an LTE-LAA signal and high gain amplification to a WLAN signal, with the outputs being provided over connections 526 and 528. In the exemplary embodiment shown in FIG. 6, the switches 571, 583 and 584 are closed, or conductive, thus allowing the LNA output to be provided over the first output 526 and the second output 528. Switches 561 and 572 are open, for example, such that the shared coupling circuit 520 is disengaged. In an exemplary embodiment, an LTE-LAA signal may be provided from connection 526 to the receiver 350 (FIG. 3), and a WLAN signal may be provided over connection 528 to the receiver 355 (FIG. 3), which may be a WLAN receiver in this example.

LAA-WLAN Concurrent High Gain/Low Gain Mode

Figure 7:
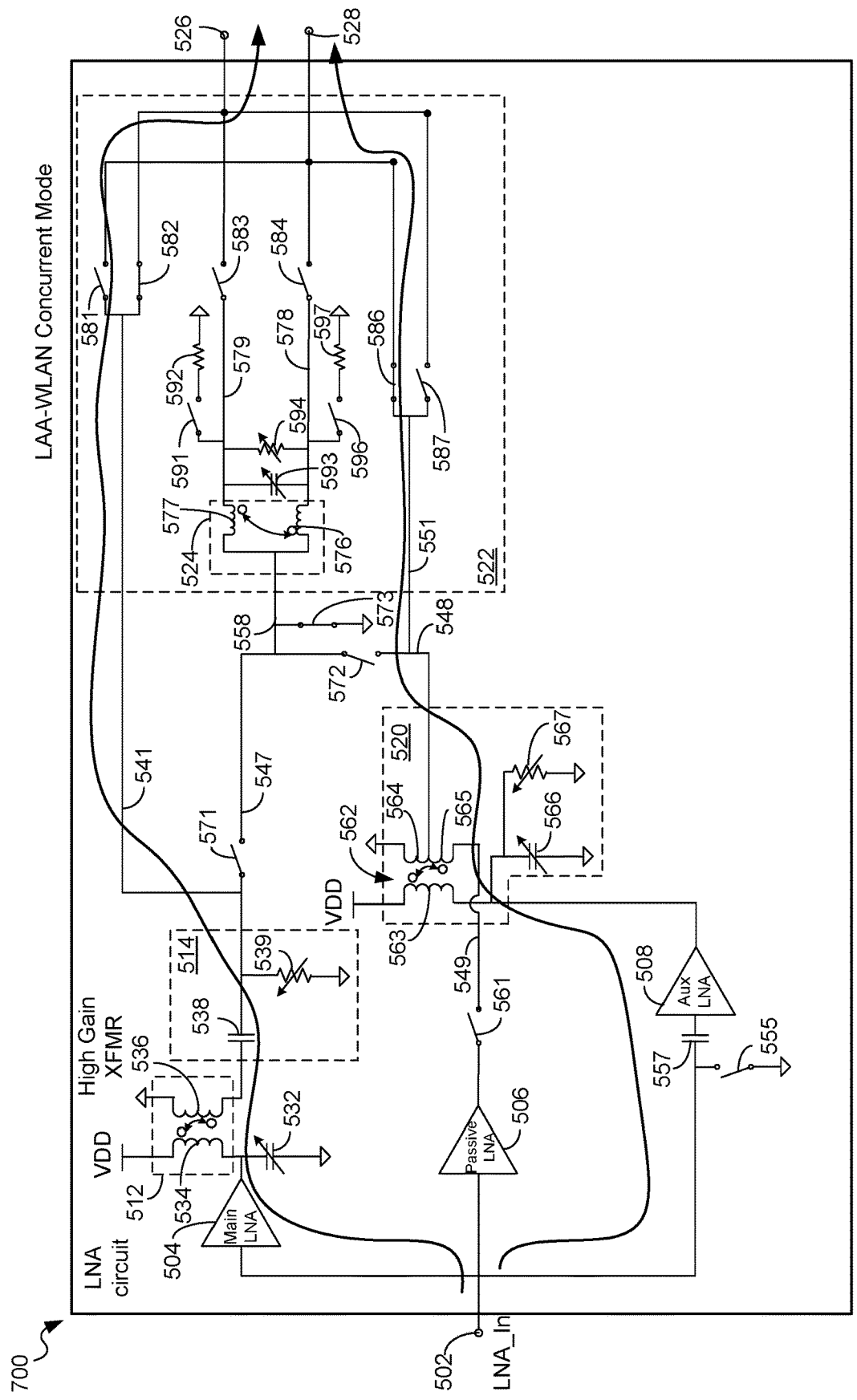
FIG. 7 is a schematic diagram of an exemplary embodiment of an LNA circuit.

FIG. 7 is a schematic diagram 700 of an exemplary embodiment of an LNA circuit. The LNA circuit 700 may be an exemplary embodiment of the LNA circuit 500 of FIG. 5, configured for LAA-WLAN concurrent high gain and low gain mode operation.

In an exemplary embodiment, the main LNA 504, high-gain transformer 512, impedance matching circuit 514, and switch circuit 522 may be configured to provide concurrent high gain amplification to an LTE-LAA signal; and the active low gain LNA 508, shared coupling circuit 520, and switch circuit 522 may be configured to provide concurrent low gain amplification to a WLAN signal with the outputs being provided over connections 526 and 528, respectively. In the exemplary embodiment shown in FIG. 7, the switches 582 and 586 are closed, or conductive, thus allowing the LTE-LAA output to be provided over the first output 526 and the WLAN output to be provided over the second output 528. Switches 561 and 572 are open, for example, such that the passive low gain LNA 506 does not pass a signal to the shared coupling circuit 520 and the output of the shared coupling circuit 520 is directed to connection 551. In an exemplary embodiment, an LTE-LAA signal may be provided from connection 526 to the receiver 350 (FIG. 3), and a WLAN signal may be provided over connection 528 to the receiver 355 (FIG. 3), which may be a WLAN receiver in this example. Alternatively, the switches 581 and 587 may be closed, and the switches 582 and 586 open such that the LTE-LAA output may be provided over the second output 528 and such that the WLAN—output be provided over the first output 526. Typically, one output port will be dedicated to an LTE-LAA signal and the other output port will be dedicated to a WLAN signal.

WLAN-LAA Concurrent High Gain/Low Gain Mode

Figure 8:
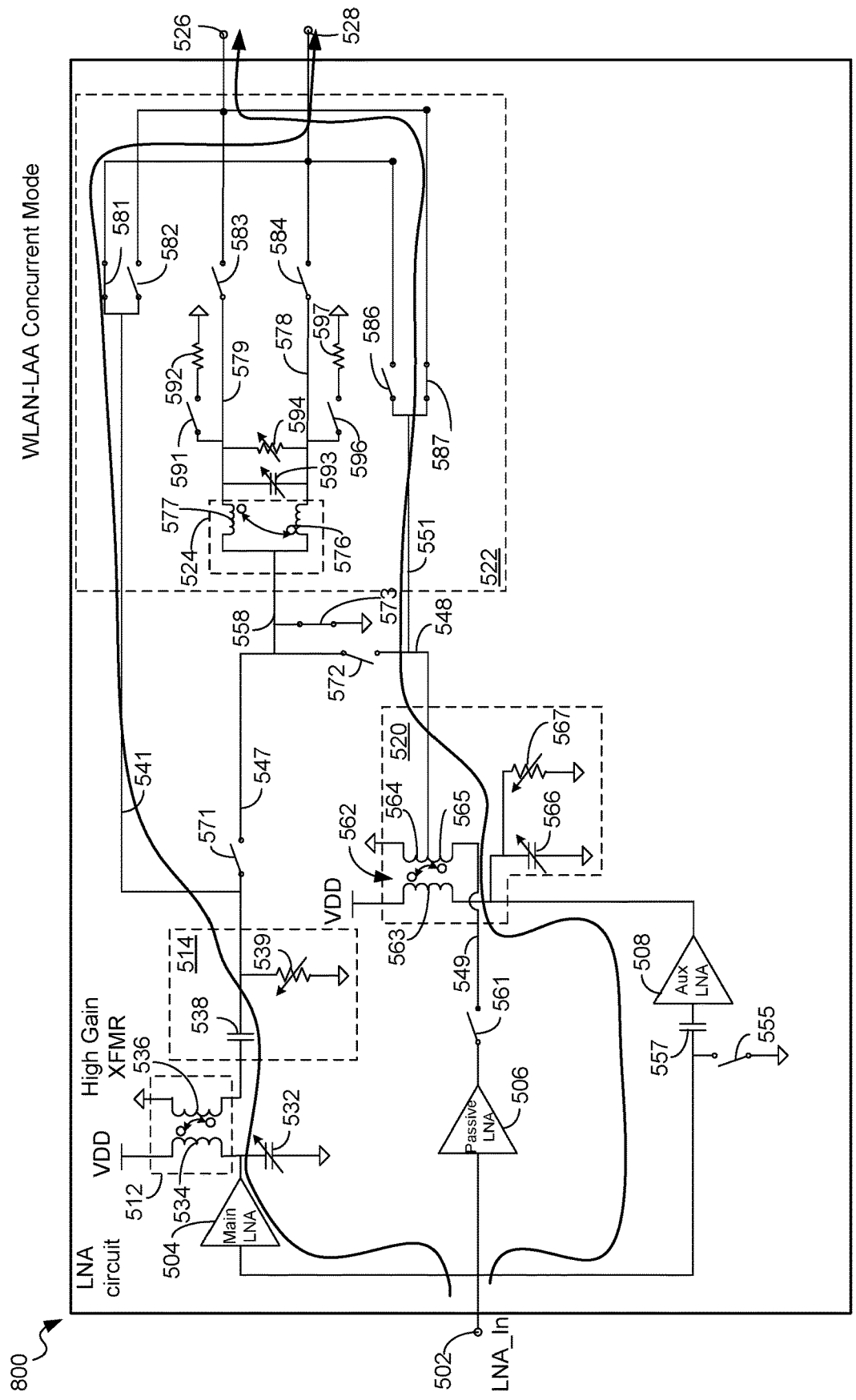
FIG. 8 is a schematic diagram of an exemplary embodiment of an LNA circuit.

FIG. 8 is a schematic diagram 800 of an exemplary embodiment of an LNA circuit. The LNA circuit 800 may be an exemplary embodiment of the LNA circuit 500 of FIG. 5, configured for WLAN-LAA concurrent high gain and low gain mode operation.

In an exemplary embodiment, the main LNA 504, high-gain transformer 512, impedance matching circuit 514, and switch circuit 522 may be configured to provide concurrent high gain amplification to a WLAN signal; and the active low gain LNA 508, shared coupling circuit 520, and switch circuit 522 may be configured to provide concurrent low gain amplification to an LTE-LAA signal with the outputs being provided over connections 528 and 526, respectively.

In the exemplary embodiment shown in FIG. 8, the switches 581 and 587 are closed, or conductive, thus allowing the WLAN output to be provided over the second output 528 and the LTE-LAA output to be provided over the first output 526. Switches 561 and 572 are open, for example, such that the passive low gain LNA 506 does not pass a signal to the shared coupling circuit 520 and the output of the shared coupling circuit 520 is directed to connection 551. In an exemplary embodiment, an LTE-LAA signal may be provided from connection 526 to the receiver 350 (FIG. 3), and a WLAN signal may be provided over connection 528 to the receiver 355 (FIG. 3), which may be a WLAN receiver in this example.

LAA-WLAN Concurrent Low Gain Mode

Figure 9:
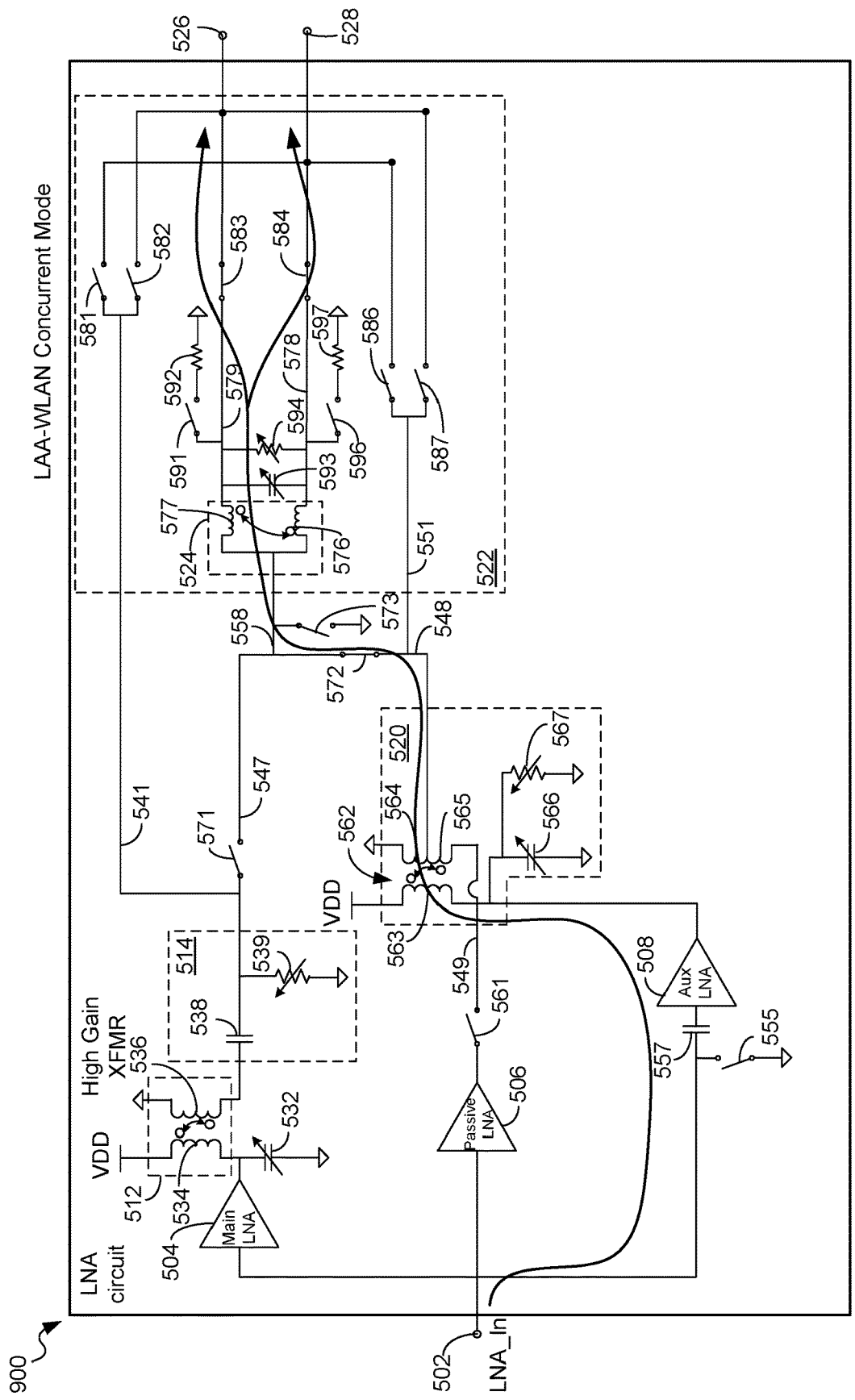
FIG. 9 is a schematic diagram of an exemplary embodiment of an LNA circuit.

FIG. 9 is a schematic diagram 900 of an exemplary embodiment of an LNA circuit. The LNA circuit 900 may be an exemplary embodiment of the LNA circuit 500 of FIG. 5. For example, the LNA circuit 900 may be configured for LAA-WLAN concurrent low gain mode operation.

In an exemplary embodiment, the active LNA 508, shared coupling circuit 520, and splitter 524 may be configured to provide low gain amplification concurrently to an LAA signal and to a WLAN signal with the outputs being provided over connections 526 and 528. In the exemplary embodiment shown in FIG. 9, the switches 572, 583 and 584 are closed, or conductive, thus allowing the LTE-LAA output to be provided over the first output 526 and the WLAN output to be provided over the second output 528. Alternatively, the LTE-LAA output may be provided over the second output 528 and the WLAN output may be provided over the first output 526. Switch 561 is open, for example, such that the passive low gain LNA 506 does not pass a signal to the shared coupling circuit 520. In one exemplary embodiment, both LAA and WLAN signals are provided to outputs 526, 528, respectively, after each having been amplified with a gain of −3 dB. In an exemplary embodiment, an LTE-LAA signal may be provided from connection 526 to the receiver 350 (FIG. 3), and a WLAN signal may be provided over connection 528 to the receiver 355 (FIG. 3), which may be a WLAN receiver in this example. In an alternative exemplary embodiment, the passive LNA 506, shared coupling circuit 520, and splitter 524 may also be configured to provide one or more levels of low gain amplification concurrently to an LAA signal and to a WLAN signal.

LAA Only or WLAN Only High Gain Mode

Figure 10:
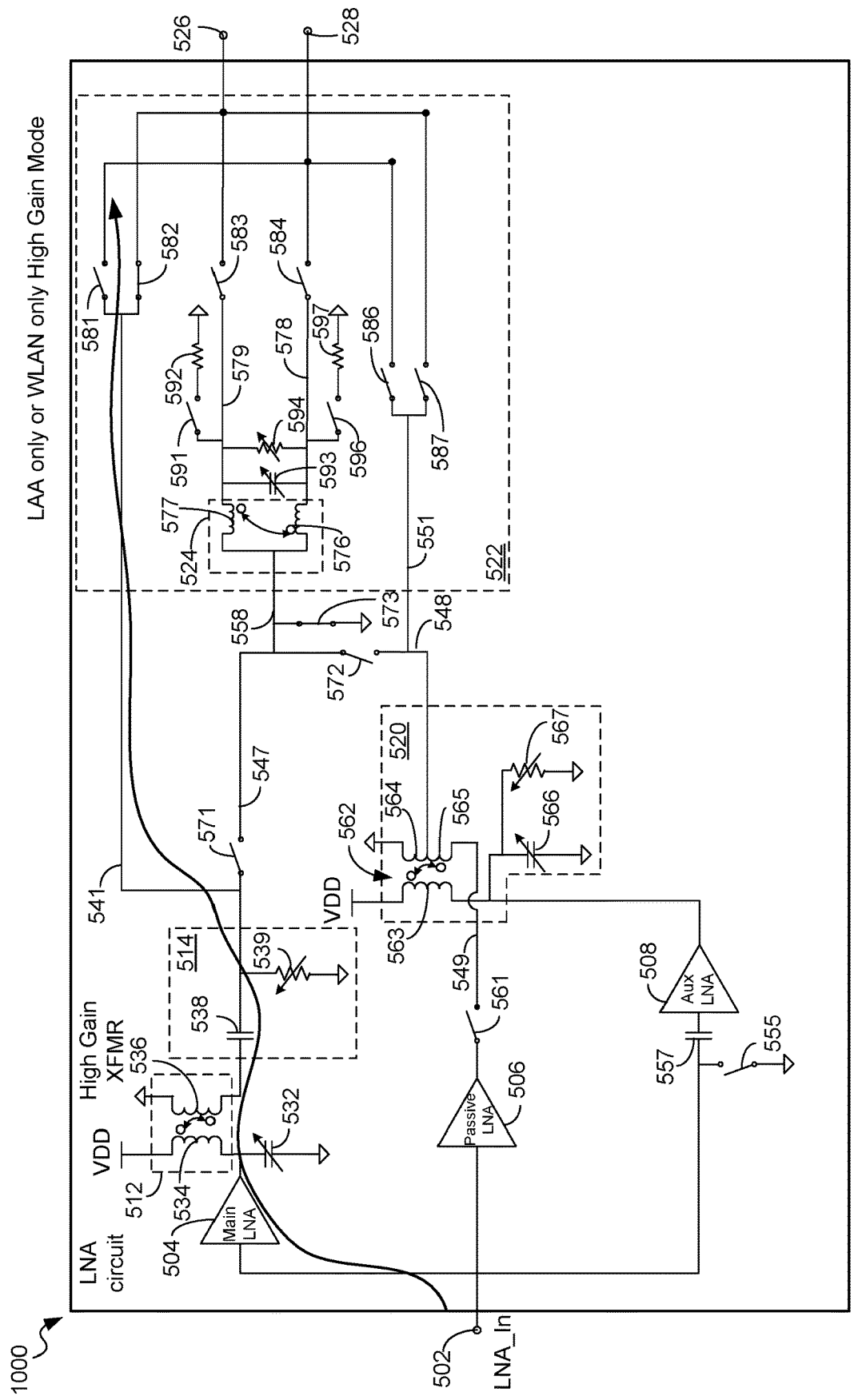
FIG. 10 is a schematic diagram of an exemplary embodiment of an LNA circuit.

FIG. 10 is a schematic diagram 1000 of an exemplary embodiment of an LNA circuit. The LNA circuit 1000 may be an exemplary embodiment of the LNA circuit 500 of FIG. 5, configured for LAA only or WLAN only high gain mode operation. In an exemplary embodiment, the main LNA 504, high-gain transformer 512, impedance matching circuit 514 and switch circuit 522 may be configured to provide LAA only or WLAN only amplification for the LAA signal or the WLAN signal in a high-gain mode with the outputs being provided over connections 526 or 528. In the exemplary embodiment shown in FIG. 10, the switch 582 is closed, or conductive, thus allowing the LTE-LAA output or the WLAN output to be provided over the first output 526. When the switch 581 is closed and the switch 582 is open the LTE-LAA output or the WLAN output can be provided over the second output 528. Switches 561, 571 and 572 are open, for example, such that the passive low gain LNA 506 does not pass a signal to the shared coupling circuit 520 and the output of the impedance matching circuit 514 is directed to connection 541. In an exemplary embodiment, an LTE-LAA signal or a WLAN signal may be provided from connection 526 to the receiver 350 (FIG. 3), or to the receiver 355 (FIG. 3), which may be a WLAN receiver in this example.

LAA Only or WLAN Only Low Gain Mode

Figure 11:
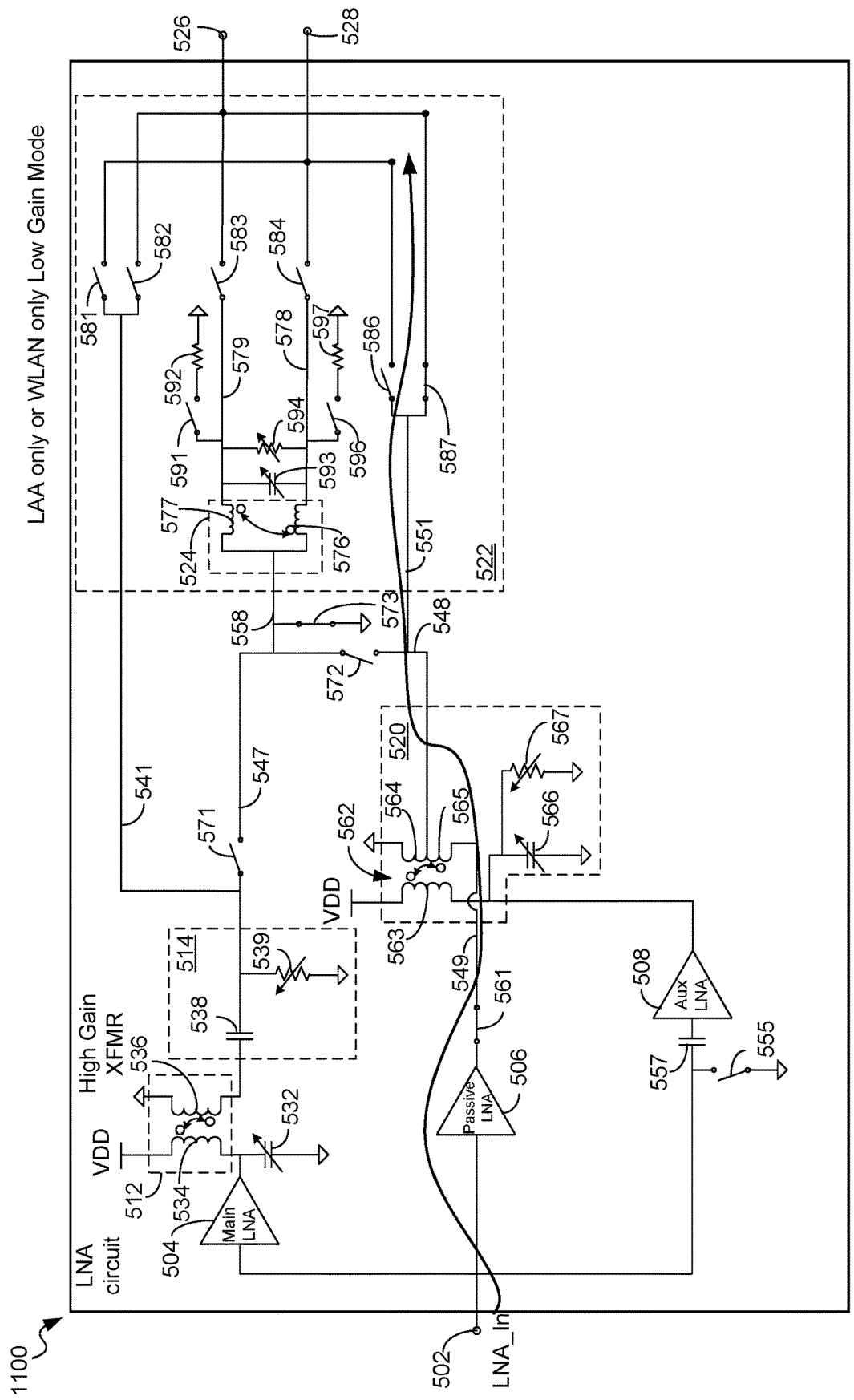
FIG. 11 is a schematic diagram of an exemplary embodiment of an LNA circuit.

FIG. 11 is a schematic diagram 1100 of an exemplary embodiment of an LNA circuit. The LNA circuit 1100 may be an exemplary embodiment of the LNA circuit 500 of FIG. 5, configured for LAA only or WLAN only low gain mode operation. In an exemplary embodiment, the passive low gain LNA 506, shared coupling circuit 520, and switch circuit 522 may be configured to provide LAA only or WLAN only low gain amplification for the LAA signal or the WLAN signal in a low-gain mode with the outputs being provided over connections 526 or 528. In the exemplary embodiment shown in FIG. 11, the switches 561, 573, and 587 are closed, or conductive, thus allowing the LTE-LAA output or the WLAN output to be provided over the first output 526. When the switch 586 is closed and the switch 587 is open the LTE-LAA output or the WLAN output can be provided over the second output 528. Switches 571 and 572 are open, for example, such that the output of the shared coupling circuit 520 is directed to connection 551. In an exemplary embodiment, an LTE-LAA signal or a WLAN signal may be provided from connection 528 to the receiver 350 (FIG. 3), or to the receiver 355 (FIG. 3), which may be a WLAN receiver in this example.

LAA Only Intra-Band Carrier Aggregation Low Gain Mode

Figure 12:
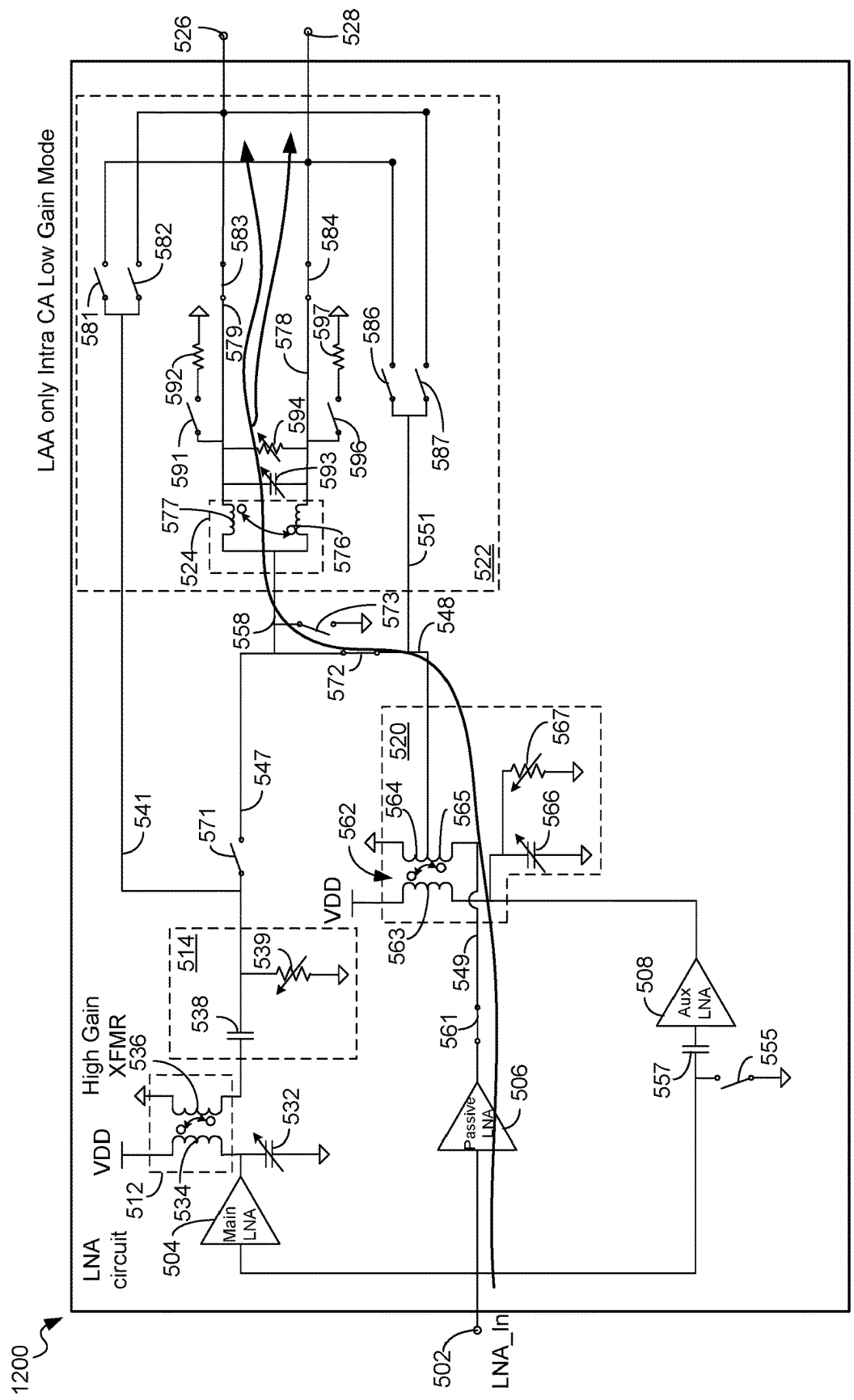
FIG. 12 is a schematic diagram of an exemplary embodiment of an LNA circuit.

FIG. 12 is a schematic diagram 1200 of an exemplary embodiment of an LNA circuit. The LNA circuit 1200 may be an exemplary embodiment of the LNA circuit 500 of FIG. 5, configured for LAA only intra-band carrier aggregation low gain mode operation. In an exemplary embodiment, the passive low gain LNA 506, shared coupling circuit 520, splitter 524 and output circuit 522 may be configured to provide LAA low gain amplification only for an LAA intra-band carrier aggregation signal in a legacy low-gain mode with the outputs being provided over connections 526 and 528. In the exemplary embodiment shown in FIG. 12, the switches 561, 572, 583 and 584 are closed, or conductive, thus allowing the LTE-LAA intra-band carrier aggregation output to be provided over the first output 526 and the second output 528. In some embodiments, the outputs are for non-contiguous intra-band carrier aggregation. Switches 571 and 573 are open, for example, such that the output of the shared coupling circuit 520 is directed to connection 558. In an exemplary embodiment, an LTE-LAA signal may be provided from connection 526 and connection 528 to the receiver 350 (FIG. 3).

LAA Only Intra-Band Carrier Aggregation High Gain Mode

Figure 13:
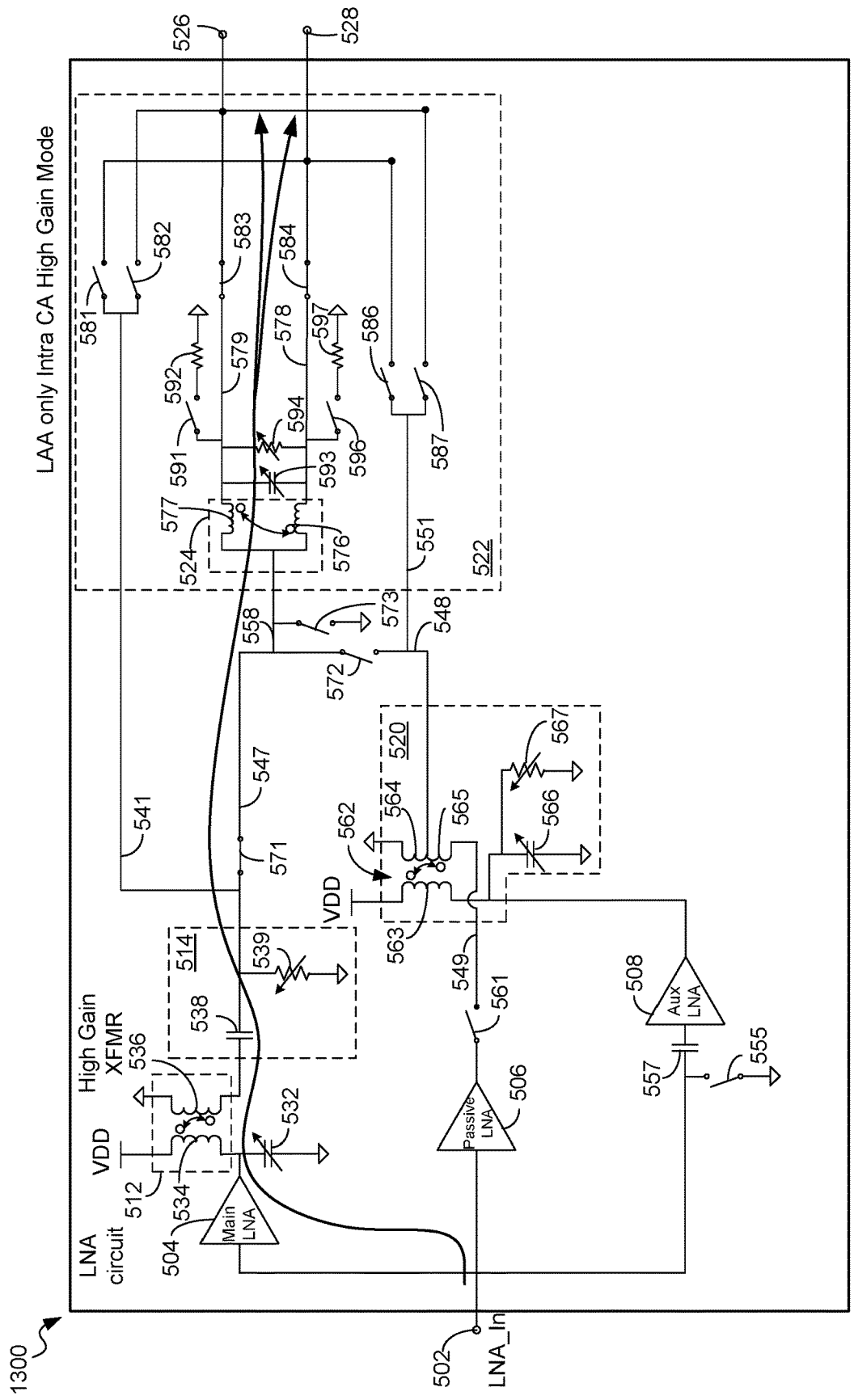
FIG. 13 is a schematic diagram of an exemplary embodiment of an LNA circuit.

FIG. 13 is a schematic diagram 1300 of an exemplary embodiment of an LNA circuit. The LNA circuit 1300 may be an exemplary embodiment of the LNA circuit 500 of FIG. 5, configured for LAA only intra-band carrier aggregation high gain mode operation. In an exemplary embodiment, the main LNA 504, high-gain transformer 512, impedance matching circuit 514, splitter 524, and output circuit 522 may be configured to provide LAA high gain amplification only for an LAA intra-band carrier aggregation signal in a legacy high-gain mode with the outputs being provided over connections 526 and 528. In the exemplary embodiment shown in FIG. 13, the switches 571, 583 and 584 are closed, or conductive, thus allowing the LTE-LAA intra-band carrier aggregation output to be provided over the first output 526 and the second output 528. In some embodiments, the outputs are for non-contiguous intra-band carrier aggregation. Switches 561, 572 and 573 are open, for example, such that the passive low gain LNA 506 does not pass a signal to the shared coupling circuit 520 and the output of the impedance matching circuit 514 is directed to connections 547 and 558. In an exemplary embodiment, an LTE-LAA signal may be provided from connection 526 and connection 528 to the receiver 350 (FIG. 3).

LAA Intra-Band Carrier Aggregation High Gain Mode, WLAN Low Gain Mode

Figure 14:
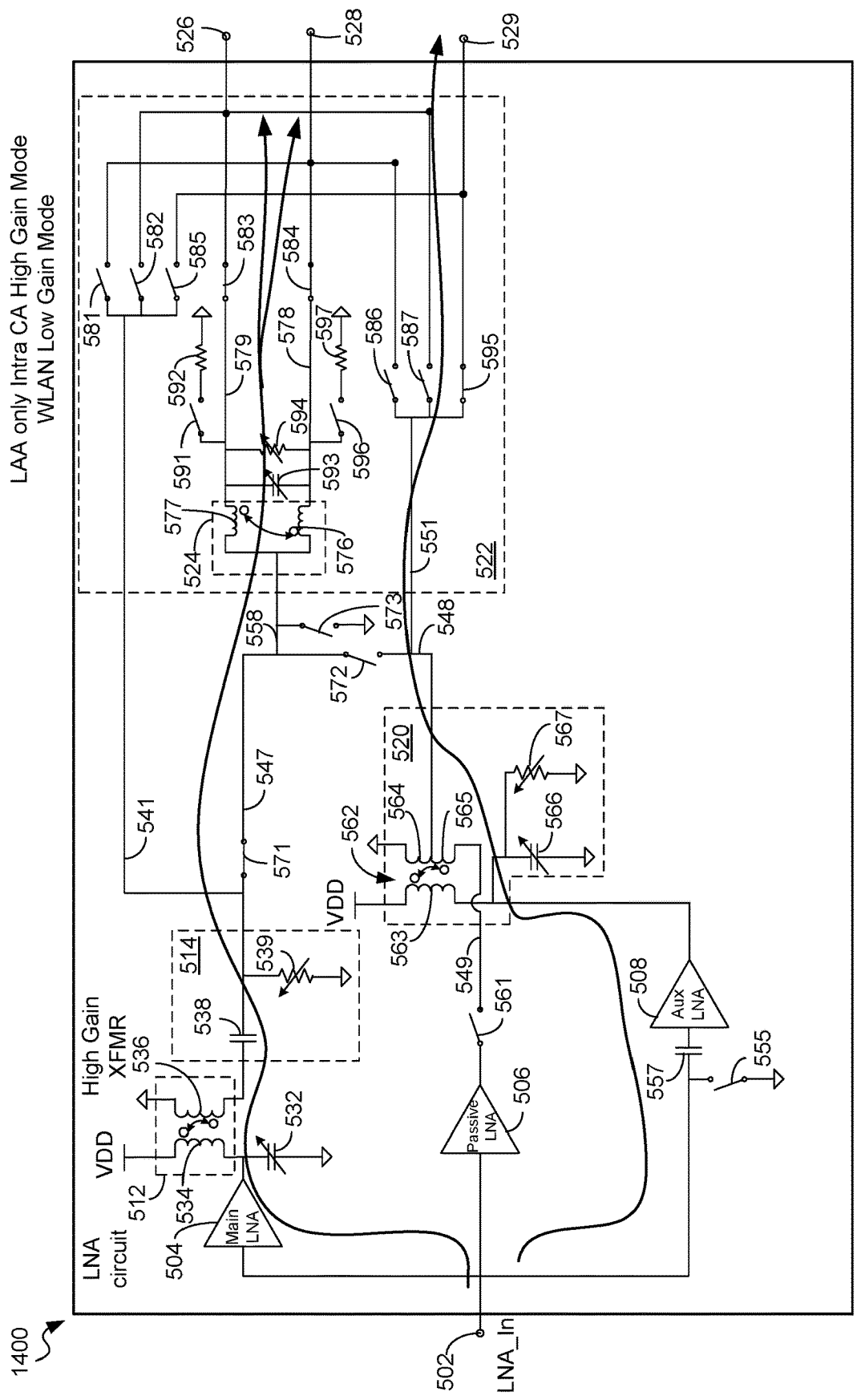
FIG. 14 is a schematic diagram of an exemplary embodiment of an LNA circuit.

FIG. 14 is a schematic diagram 1400 of an exemplary embodiment of an LNA circuit. The LNA circuit 1400 may be an exemplary embodiment of the LNA circuit 500 of FIG. 5, configured for LAA intra-band carrier aggregation high gain mode operation and also configured to provide a third output 529. Exemplary switches 585 and 595 may be included in the switch circuit 522 to provide connection to the third output 529. In the exemplary embodiment shown in FIG. 14, the third output 529 may be configured to provide low gain amplification to a WLAN communication signal concurrently with the LAA intra-band carrier aggregation signal. In an exemplary embodiment, the main LNA 504, high-gain transformer 512, impedance matching circuit 514, splitter 524, and output circuit 522 may be configured to provide LAA high gain amplification for an LAA intra-band carrier aggregation signal in a high-gain mode with the outputs being provided over connections 526 and 528. In the exemplary embodiment shown in FIG. 14, the switches 571, 583 and 584 are closed, or conductive, thus allowing the LTE-LAA intra-band carrier aggregation output to be provided over the first output 526 and the second output 528. Concurrently, in an exemplary embodiment, the active low gain LNA 508, shared coupling circuit 520, and switch circuit 522 may be configured to provide concurrent low gain amplification to a WLAN signal with the outputs being provided over the third output over connection 529. In the exemplary embodiment shown in FIG. 14, the switch 595 is closed, or conductive, thus allowing the WLAN output to be provided over the third output 529. Switches 561, 572, and 573 are open, for example, such that the passive low gain LNA 506 does not pass a signal to the shared coupling circuit 520 and the output of the shared coupling circuit 520 is directed to connection 551. In an exemplary embodiment, an LTE-LAA signal may be provided from connection 526 and connection 528 to the receiver 350 (FIG. 3), and a WLAN signal may be provided over connection 529 to the receiver 355 (FIG. 3), which may be a WLAN receiver in this example. Although described in FIG. 14 as the LAA signal amplified with high gain and the WLAN signal being amplified with low gain, these descriptions are for example purposes only. Any combination of high gain and low gain amplification may be provided to the three exemplary signals in this example. Further, while shown as amplifying three signals, the architecture of the LNA circuit 1400, and the other exemplary LNA circuits described herein, may be extended to more than three outputs. Further, in alternative exemplary embodiments, the LNA circuit 1400 may be configured for LAA intra-band carrier aggregation low gain mode, WLAN high gain mode by turning on switches 585, 572, 583, and 584; may be configured for LAA intra-band carrier aggregation high gain mode, WLAN high gain mode by turning on switches 571, 583, 584, and 585; and may be configured for LAA intra-band carrier aggregation low gain mode, WLAN low gain mode by turning on switches 572, 583, 584, and 595.

Figure 15:
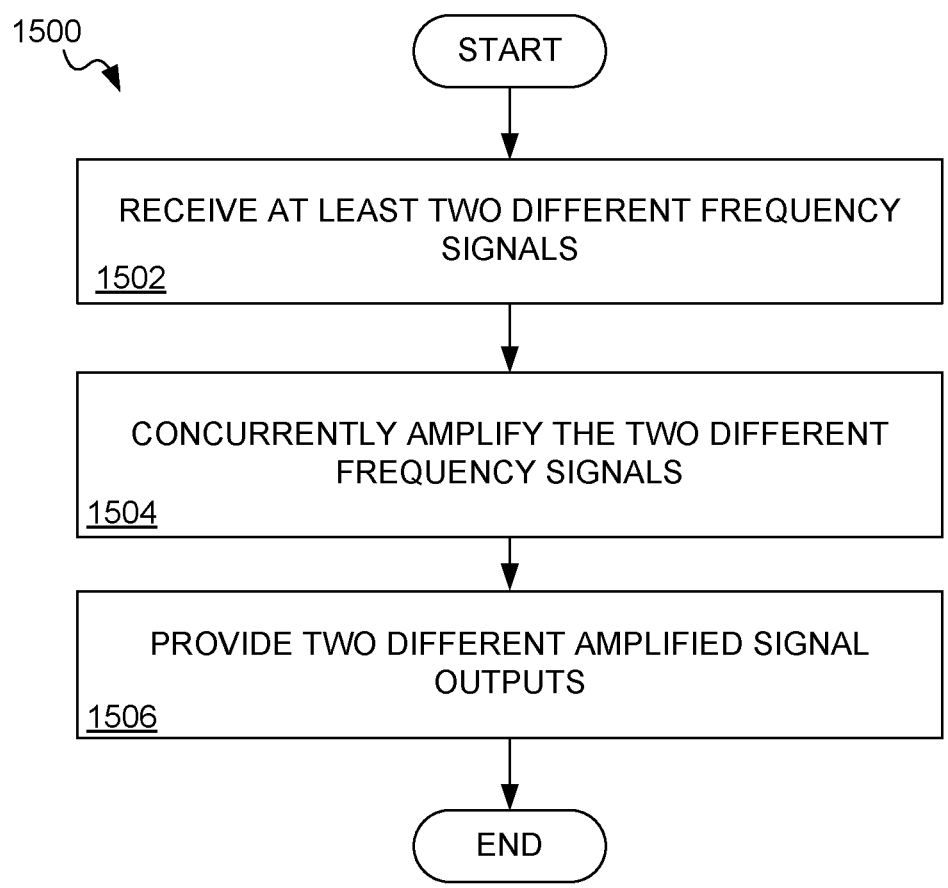
FIG. 15 is a flow chart describing an example of the operation of an LNA circuit in accordance with an exemplary embodiment of the disclosure.

FIG. 15 is a flow chart 1500 describing an example of the operation of a low noise amplifier in accordance with an exemplary embodiment. The blocks in the method 1400 can be performed in or out of the order shown, and in some embodiments, can be performed at least in part in parallel.

In block 1502, at least two different frequency signals are received in a low noise amplifier (LNA) circuit. In an exemplary embodiment, two different carrier signals having different frequencies (or frequency bands that at least partially overlap in some configurations) are received at LNA circuit 400.

In block 1504, the LNA circuit concurrently amplifies the at least two different frequency signals. For example, the LNA circuit 400 may amplify an LTE-LAA signal and a WLAN signal at one or more amplification levels.

In block 1506, the amplified two different frequency signals are provided from the LNA circuit 400.

Figure 16:
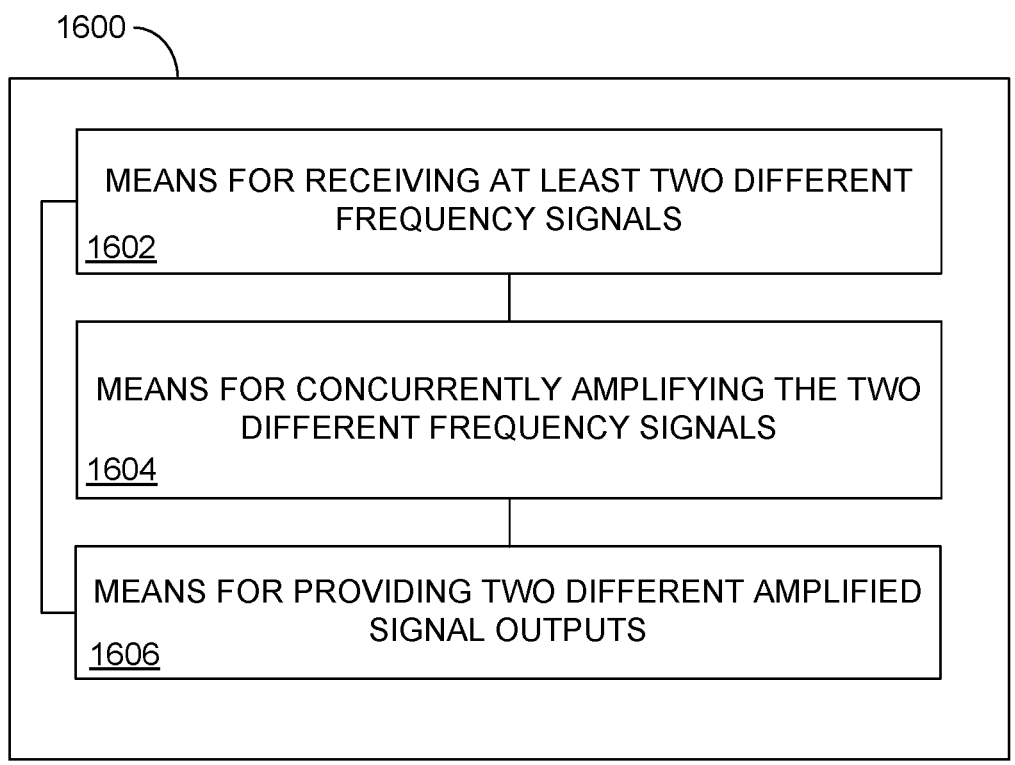
FIG. 16 is a functional block diagram of an apparatus for an LNA circuit in accordance with an exemplary embodiment of the disclosure.

FIG. 16 is a functional block diagram of an apparatus for a low noise amplifier in accordance with an exemplary embodiment. The apparatus 1600 comprises means 1602 for receiving least two different frequency signals. In certain embodiments, the means 1602 for receiving least two different frequency signals can be configured to perform one or more of the function described in operation block 1502 of method 1500 (FIG. 15). In an exemplary embodiment, the means 1602 for receiving least two different frequency signals may comprise receiving an LTE-LAA signal and a WLAN signal in the LNA circuit 400.

The apparatus 1600 further comprises means 1604 for concurrently amplifying the at least two different frequency signals. In certain embodiments, the means 1604 for concurrently amplifying the at least two different frequency signals can be configured to perform one or more of the function described in operation block 1504 of method 1500 (FIG. 15). In an exemplary embodiment, the means 1604 for concurrently amplifying the at least two different frequency signals may comprise the LNA circuit 400 amplifying an LTE-LAA signal and a WLAN signal at one or more amplification levels.

The apparatus 1600 further comprises means 1606 for providing two different amplified signal outputs. In certain embodiments, the means 1606 for providing two different amplified signal outputs can be configured to perform one or more of the function described in operation block 1506 of method 1500 (FIG. 15). In an exemplary embodiment, the means 1606 for providing two different amplified signal outputs may comprise the LNA circuit 400 providing the amplified two different frequency signals.

The receiver architecture described herein described herein may be implemented on one or more ICs, analog ICs, RFICs, mixed-signal ICs, ASICs, printed circuit boards (PCBs), electronic devices, etc. The receiver described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the receiver described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. A circuit, comprising:
   a passive low gain low noise amplifier (LNA) configured to receive a communication signal;
   an active low gain LNA configured to receive the communication signal;
   a shared coupling circuit, outputs of the passive low gain LNA and the active low gain LNA coupled to the shared coupling circuit;
   an output circuit, an output of the shared coupling circuit coupled to the output circuit; and
   a high gain LNA configured to receive the communication signal, the high gain LNA coupled to the output circuit along a path that bypasses the shared coupling circuit.

2. The circuit of claim 1, further comprising:
   a transformer circuit coupled to an output of the high gain LNA; and
   an impedance matching circuit coupled to an output of the transformer circuit, an output of the impedance matching circuit coupled to the output circuit.

3. The circuit of claim 1, wherein the passive low gain LNA, active low gain LNA and high gain LNA are coupled to a common input, and the communication signal is received at the common input.

4. The circuit of claim 1, wherein the shared coupling circuit comprises an inductive element comprising a primary side and a secondary side, the secondary side comprising an upper secondary side and a lower secondary side.

5. The circuit of claim 4, wherein the active low gain LNA is coupled to the primary side of the shared coupling circuit, and wherein the output of the shared coupling circuit is coupled to a node between the upper secondary side and the lower secondary side.

6. The circuit of claim 4, wherein the passive low gain LNA is coupled to the lower secondary side of the shared coupling circuit, and wherein the output of the shared coupling circuit is coupled to a node between the upper secondary side and the lower secondary side.

7. The circuit of claim 1, wherein the output circuit is configured to concurrently process at least three communication signals.

8. The circuit of claim 7, wherein the at least three communications signals comprise an LTE-licensed assisted access (LAA) communication signal, a wireless local area network (WLAN) communication signal, and another communication signal selected from an LTE communication signal, a CDMA communication signal, a 4G communication signal, a 5G communication signal, a cellular communication signal, and a Bluetooth communication signal.

9. The circuit of claim 1, wherein the shared coupling circuit is configured as a transformer having two coils between the passive low gain LNA and the output of the shared coupling circuit.

10. The circuit of claim 9, wherein the shared coupling circuit is configured as an auto-transformer between the active low gain LNA and the output of the shared coupling circuit.

11. A method for a low noise amplifier (LNA), comprising:
- receiving a communication signal in a high gain low noise amplifier (LNA), the high gain LNA coupled to an output circuit;
- receiving the communication signal in a passive low gain LNA and an active low gain LNA, the passive low gain LNA and the active low gain LNA coupled to a shared coupling circuit, an output of the shared coupling circuit coupled to the output circuit; and
- amplifying the communication signal using one or more of the high gain LNA, the passive low gain LNA and the active low gain LNA.

12. The method of claim 11, wherein the communication signal comprises a combined LTE-licensed assisted access-wireless local area network (LAA-WLAN) communication signal and the method further comprises concurrently amplifying the combined LAA-WLAN communication signal with low gain.

13. The method of claim 11, wherein the communication signal comprises at least one of an LTE-licensed assisted access (LAA) communication signal, a wireless local area network (WLAN) communication signal, an LTE communication signal, a CDMA communication signal, a 4G communication signal, a 5G communication signal, a cellular communication signal, and a Bluetooth communication signal and the method further comprises amplifying at least one of the LTE-licensed assisted access (LAA) communication signal, the wireless local area network (WLAN) communication signal, the LTE communication signal, the CDMA communication signal, the 4G communication signal, the 5G communication signal, the cellular communication signal, and the Bluetooth communication signal with low gain.

14. The method of claim 11, wherein the communication signal comprises an intra-band carrier aggregation LTE-licensed assisted access (LAA) communication signal and the method further comprises amplifying the intra-band carrier aggregation LAA communication signal with low gain.

15. The method of claim 11, wherein the communication signal comprises a combined LTE-licensed assisted access-wireless local area network (LAA-WLAN) communication signal and the method further comprises concurrently amplifying the combined LAA-WLAN communication signal with high gain.

16. The method of claim 11, wherein the communication signal comprises at least one of an LTE-licensed assisted access (LAA) communication signal and a wireless local area network (WLAN) communication signal and the method further comprises concurrently amplifying one of the LAA or WLAN communication signals with high gain and amplifying the other of the LAA or WLAN communication signals with low gain.

17. The method of claim 11, wherein the communication signal comprises at least one of an LTE-licensed assisted access (LAA) communication signal, a wireless local area network (WLAN) communication signal, an LTE communication signal, a CDMA communication signal, a 4G communication signal, a 5G communication signal, a cellular communication signal, and a Bluetooth communication signal and the method further comprises amplifying at least one of the LTE-licensed assisted access (LAA) communication signal, the wireless local area network (WLAN) communication signal, the LTE communication signal, the CDMA communication signal, the 4G communication signal, the 5G communication signal, the cellular communication signal, and the Bluetooth communication signal with high gain.

18. The method of claim 11, wherein the communication signal comprises an intra-band carrier aggregation LTE-licensed assisted access (LAA) communication signal and the method further comprises amplifying the intra-band carrier aggregation LAA communication signal with high gain.

* * * * *